(12) United States Patent
Matsumoto

(10) Patent No.: US 11,295,790 B2
(45) Date of Patent: Apr. 5, 2022

(54) MEMORY INTERFACE CIRCUIT AND CONTROLLER

(71) Applicant: KIOXIA CORPORATION, Tokyo (JP)

(72) Inventor: Shuuji Matsumoto, Sagamihara Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/011,850

(22) Filed: Sep. 3, 2020

(65) Prior Publication Data
US 2021/0118474 A1 Apr. 22, 2021

(30) Foreign Application Priority Data
Oct. 17, 2019 (JP) .............................. JP2019-190509

(51) Int. Cl.
*G06F 1/04* (2006.01)
*G11C 7/10* (2006.01)
*G11C 7/22* (2006.01)

(52) U.S. Cl.
CPC ............ *G11C 7/1057* (2013.01); *G11C 7/106* (2013.01); *G11C 7/1045* (2013.01); *G11C 7/1072* (2013.01); *G11C 7/1084* (2013.01); *G11C 7/22* (2013.01)

(58) Field of Classification Search
CPC ..... G11C 7/1045; G11C 7/106; G11C 7/1072; G11C 7/1084; G11C 7/22
USPC ...................................................... 365/189.05
See application file for complete search history.

(56) References Cited

U.S. PATENT DOCUMENTS

| | | |
|---|---|---|
| 6,803,793 B2 | 10/2004 | Inoue |
| 7,521,978 B2 * | 4/2009 | Kim .......................... G06F 1/10 327/291 |
| 9,391,601 B2 | 7/2016 | Hwang et al. |
| 9,921,772 B2 | 3/2018 | Atsumi et al. |
| 11,044,123 B2 * | 6/2021 | Finn ..................... G11C 29/028 |
| 2007/0103220 A1 * | 5/2007 | Kim .......................... G06F 1/10 327/291 |
| 2020/0004505 A1 | 1/2020 | Atsumi et al. |
| 2021/0067385 A1 * | 3/2021 | Finn ..................... G11C 29/028 |

FOREIGN PATENT DOCUMENTS

JP 2011-250107 A 12/2011

* cited by examiner

*Primary Examiner* — Xiaochun L Chen
(74) *Attorney, Agent, or Firm* — Kim & Stewart LLP

(57) ABSTRACT

A memory interface circuit includes a first output buffer circuit, a second output buffer circuit, a switching element, and a control circuit. The first output buffer circuit includes a first output node. The second output buffer circuit includes a second output node. The switching element is electrically connected to the first output node and the second output node, and is controlled to switch electrical connection states between the first output node and the second output node. The control circuit controls the switching element.

17 Claims, 19 Drawing Sheets

FIG. 9

| (N, N+1) | (0,0) | (0,1) | (1,0) | (1,1) |
|---|---|---|---|---|
| (0,0) | OFF | OFF | OFF | OFF |
| (0,1) | OFF | OFF | ON | OFF |
| (1,0) | OFF | ON | OFF | OFF |
| (1,1) | OFF | OFF | OFF | OFF |

Columns: 20_N
Rows: 10_N

FIG. 12

| bit 0 \ bit 1 | 0 | 1 |
|---|---|---|
| 0 | OFF | ON |
| 1 | ON | OFF |

FIG. 13

| N \ N+1 | 0 | 1 |
|---|---|---|
| 0 | OFF | ON |
| 1 | ON | OFF |

MEMORY INTERFACE CIRCUIT AND CONTROLLER

CROSS-REFERENCE TO RELATED APPLICATION

This application is based upon and claims the benefit of priority from Japanese Patent Application No. 2019-190509, filed Oct. 17, 2019, the entire contents of which are incorporated herein by reference.

FIELD

Embodiments described herein relate generally to a memory interface circuit and a controller.

BACKGROUND

A semiconductor integrated circuit of the related art includes an output buffer circuit that can output high level and low level signals. It is desirable to reduce power consumption in such a semiconductor integrated circuit.

BRIEF DESCRIPTION OF THE DRAWINGS

FIG. 9 is a diagram illustrating an operation of a bypass control circuit according to the first embodiment.

FIG. 12 is a diagram illustrating an operation of a bypass control circuit according to a first modification example of the first embodiment.

FIG. 13 is a diagram illustrating an operation of a bypass control circuit according to a second modification example of the first embodiment.

DETAILED DESCRIPTION

Figure 1:
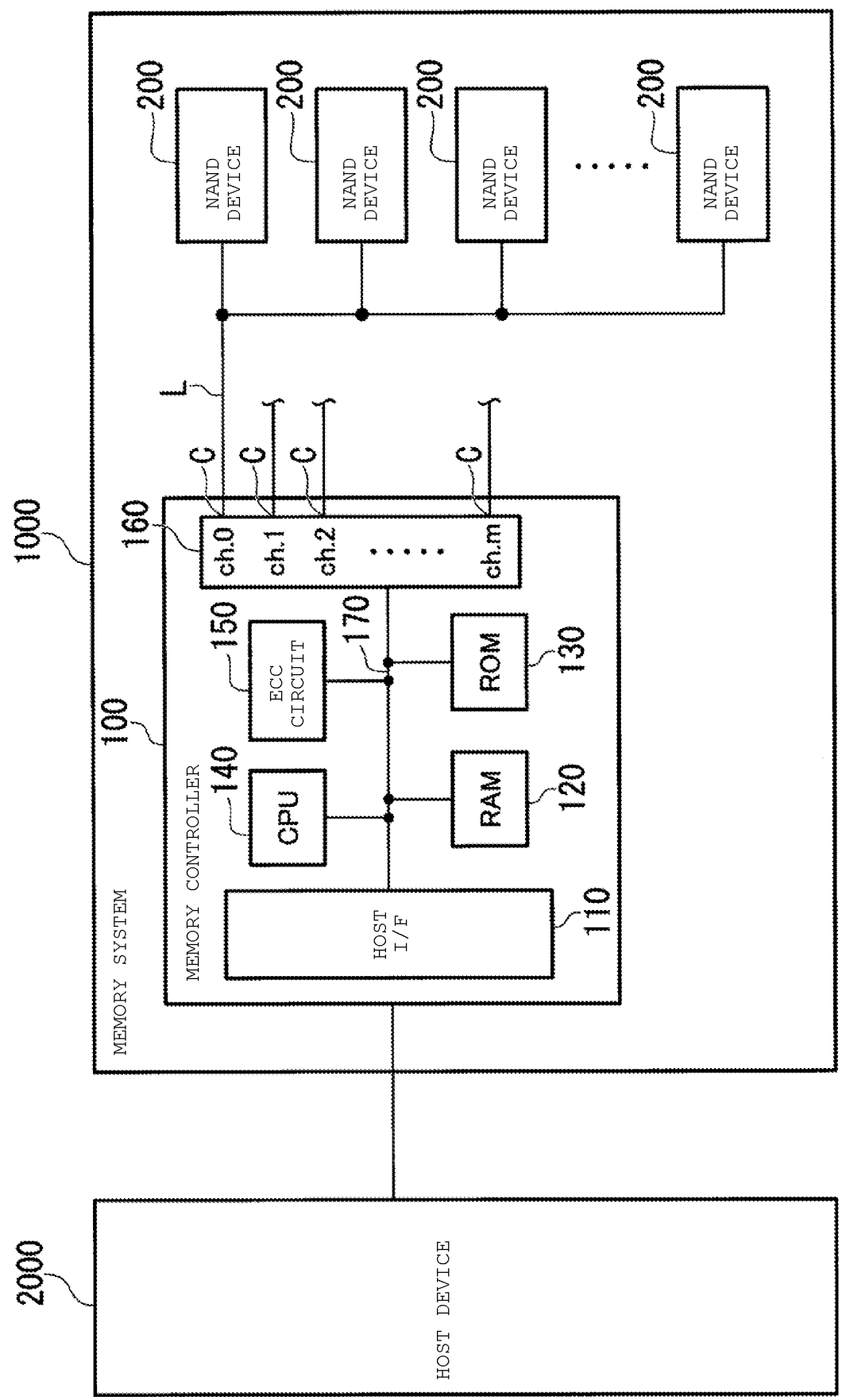
FIG. 1 is a block diagram illustrating a configuration of a memory system according to a first embodiment.

Embodiments provide a semiconductor integrated circuit and a controller capable of reducing power consumption.

In general, according to one embodiment, a memory interface circuit includes a first output buffer circuit, a second output buffer circuit, a switching element, and a control circuit. The first output buffer circuit includes a first output node. The second output buffer circuit includes a second output node. The switching element is electrically connected to the first output node and the second output node, and is controlled to switch electrical connection states between the first output node and the second output node. The control circuit controls the switching element.

Hereinafter, a semiconductor integrated circuit and a controller according to embodiments will be described with reference to the drawings. In the following description, an element having an identical or similar function will be given the same reference numeral. A repeated description of the element will be omitted in some cases. In the present specification, the phrase "based on XX" indicates "based on at least XX", and includes a case of being based on other elements in addition to XX. The phrase "based on XX" is not limited to a case of directly using XX, and also includes a case of being based on a result of performing calculation or processing on XX. "XX" is any element (for example, any information). In the present specification, the term "connection" is not limited to mechanical connection, and also includes electrical connection. In the present specification, in some cases, a conduction state of a switching element will be referred to as an "ON state", and a non-conduction state of a switching element will be referred to as an "OFF state".

A semiconductor integrated circuit in a memory system accumulates electric charge in a load from a power source (VDD) of an output buffer circuit when a signal with a high level as a voltage level is output, and releases the electric charge accumulated in the load to the ground (VSS) of the output buffer circuit when a signal with a low level as a voltage level is output. Accumulation and release of the electric charge cause a large percentage of power consumption in a semiconductor integrated circuit.

Therefore, in a semiconductor integrated circuit of an embodiment, electric charge is reused between a first output buffer circuit and a second output buffer circuit, and thus power consumption of the semiconductor integrated circuit can be reduced. Hereinafter, such a semiconductor integrated circuit will be described. However, the present disclosure is not limited to the embodiments described below.

First Embodiment

A first embodiment relates to an example of a semiconductor integrated circuit provided in a memory controller, that has two output buffer circuits, each of which is configured to reuse electric charge from the other. A semiconductor integrated circuit described below may be provided in a host connection interface instead of or in addition to a NAND connection interface, and may be provided in a host device and/or a NAND device instead of or in addition to a memory controller.

1. Overall Configuration of Memory System

FIG. 1 is a block diagram illustrating a configuration of a memory system 1000 according to a first embodiment. The memory system 1000 is, for example, a single storage device, and is connected to a host device 2000. The memory system 1000 functions as an external storage device of the host device 2000. The host device 2000 is, for example, a mobile type information processing apparatus, but may be a server apparatus or a personal computer. The host device 2000 issues access requests (a read request and a write request) to the memory system 1000.

The memory system 1000 includes, for example, a memory controller 100 and a plurality of NAND devices 200. The memory controller 100 is an example of a "controller". The NAND device 200 includes memory cells serving as a nonvolatile semiconductor memory, and is, for example, a NAND flash memory. The NAND device 200 is an example of a "semiconductor storage device".

The memory controller 100 includes, for example, a host connection interface (hereinafter, referred to as a "host I/F") 110, a random access memory (RAM) 120, a read only memory (ROM) 130, a central processing unit (CPU) 140, an error correcting code (ECC) circuit 150, and a NAND connection interface (hereinafter, referred to as a "NAND I/F") 160. The host I/F 110, the RAM 120, the ROM 130, the CPU 140, the ECC circuit 150, and the NAND I/F 160 are connected to each other via a bus 170. In one example, the memory controller 100 is implemented by a system on a chip (SoC) in which the above-described elements are provided on one chip. However, some of the host I/F 110, the RAM 120, the ROM 130, the CPU 140, the ECC circuit 150, and the NAND I/F 160 may be provided outside the memory controller 100.

The host I/F 110 executes control of a communication interface between the host device 2000 and the memory system 1000, and control of data transmission between the host device 2000 and the RAM 120, under the control of the CPU 140.

The RAM 120 is, for example, a dynamic random access memory (DRAM) or a static random access memory (SRAM), but is not limited thereto. The RAM 120 functions as a buffer for data transmission between the host device 2000 and the NAND device 200. The RAM 120 provides a work area to the CPU 140. Firmware (program) stored in the ROM 130 is loaded into the RAM 120 during an operation of the memory system 1000.

The CPU 140 is an example of a hardware processor. The CPU 140 executes, for example, the firmware loaded in the RAM 120, and controls the memory controller 100. For example, the CPU 140 controls operations such as writing, reading, and erasing of data executed on the NAND device 200.

The ECC circuit 150 performs coding for error correction on data to be written to the NAND device 200. When an error is included in data read from the NAND device 200, the ECC circuit 150 executes error correction on the read data based on an error correction code generated at the time of a write operation.

The NAND I/F 160 executes control of data transmission between the RAM 120 and the NAND device 200 under the control of the CPU 140. The NAND I/F 160 is a physical layer of the memory controller 100, and includes transmission and reception circuits. The NAND I/F 160 converts a digital signal transmitted to the NAND device 200 from the memory controller 100, into an electrical signal, and transmits the converted electrical signal to the NAND device 200 through a transmission line L. The NAND I/F 160 receives an electrical signal from the NAND device 200 through the transmission line L, and converts the received electrical signal into a digital signal. The NAND I/F 160 is an example of a "semiconductor integrated circuit".

In the present embodiment, the NAND I/F 160 has a plurality of channels C (ch.0, ch.1, . . . , and ch.m (where m is a natural number)). Each channel C is connected to a plurality of NAND devices 200. In some embodiments, only one channel C may be provided, and a single NAND device 200 may be connected to only one channel C.

2. Configurations of Memory Controller and NAND Device

Next, a description will be made of configurations of the memory controller 100 and the NAND device 200. Herein, the memory controller 100 and one NAND device 200 will be described. Relationships between the memory controller 100 and the other NAND devices 200 are the same as described below.

Figure 2:
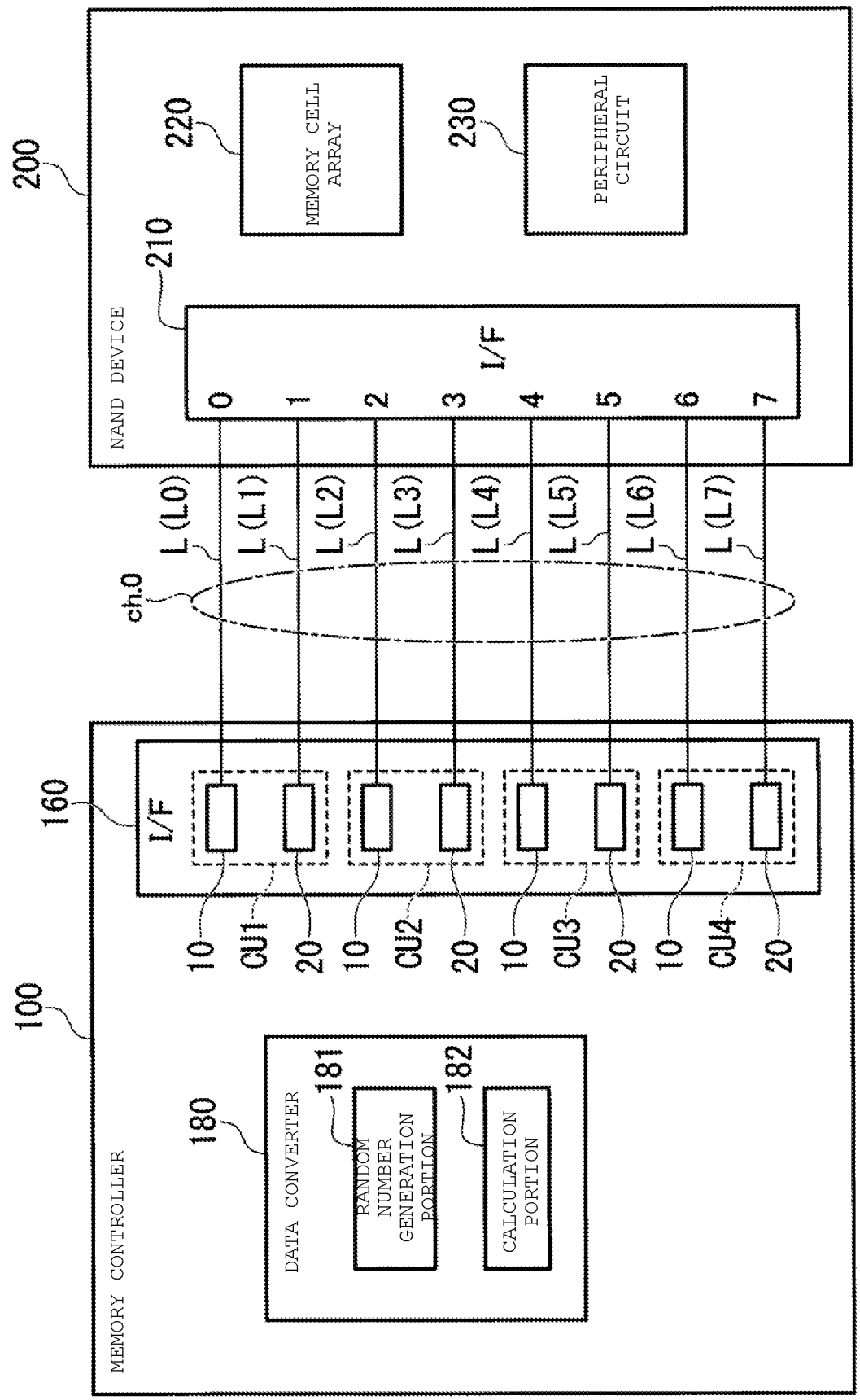
FIG. 2 is a block diagram illustrating configurations of a memory controller and a NAND device according to the first embodiment.

FIG. 2 is a block diagram illustrating configurations of the memory controller 100 and the NAND device 200, and illustrates a portion related to an output buffer circuit. FIG. 2 does not illustrate the host I/F 110, the RAM 120, the ROM 130, the CPU 140, and the ECC circuit 150. This is also the same for FIG. 17 which will be described later. In the example illustrated in FIG. 2, a single channel C is connected to a plurality of (for example, eight) transmission lines L (L0 to L7), and can thus output data (signal) of 8 bits to the single NAND device 200 in parallel.

2.1 Configuration of Memory Controller

First, a description will be made of a configuration of the memory controller 100. The memory controller 100 includes, for example, the NAND I/F 160 and a data converter 180.

2.1.1 NAND I/F

The NAND I/F 160 includes, for example, first to fourth circuit units CU1 to CU4. Each of the first to fourth circuit units CU1 to CU4 includes a first output buffer circuit 10 and a second output buffer circuit 20. In the present specification, the "output buffer circuit" is a circuit outputting a high level signal or a low level signal corresponding to an input value.

As illustrated in FIG. 2, the first output buffer circuit 10 and the second output buffer circuit 20 of the first circuit unit CU1 are respectively connected to the first transmission line L0 and the second transmission line L1. The first output buffer circuit 10 and the second output buffer circuit 20 of the second circuit unit CU2 are respectively connected to the third transmission line L2 and the fourth transmission line L3. The first output buffer circuit 10 and the second output buffer circuit 20 of the third circuit unit CU3 are respectively connected to the fifth transmission line L4 and the sixth transmission line L5. The first output buffer circuit 10 and the second output buffer circuit 20 of the fourth circuit unit CU4 are respectively connected to the seventh transmission line L6 and the eighth transmission line L7.

2.1.2 Data Converter

Next, the data converter 180 will be described. Here, when data to be written (hereinafter, referred to as "write data") to the NAND device 200 is received by the memory controller 100 from the host device 2000, bits of the write data may be biased to one of "0" or "1" data values. Write data in which the bits thereof are biased to "0" or "1" may have low storage reliability when the write data is stored in the NAND device 200. Therefore, the data converter 180 performs a process called randomizing (or scrambling) on write data such that a ratio between the data values "0" and "1" of the bits included in the write data is made close to one to one.

Specifically, the data converter 180 includes a random number generation portion 181 and a calculation portion 182. The random number generation portion 181 generates a random number (for example, a pseudo-random number). The calculation portion 182 makes a ratio between the data values "0" and "1" included in write data close to one to one by using the random number generated by the random number generation portion 181. For example, the calculation portion 182 performs an exclusive OR (XOR) calculation between the random number generated by the random number generation portion 181 and the write data, and thus generates data (hereinafter, referred to as "randomized data") in which a ratio between the data values "0" and "1" is close to one to one.

The data converter 180 separately generates the randomized data that is supplied as an input value to the first output buffer circuit 10 and the randomized data that is supplied as an input value to the second output buffer circuit 20, in each of the circuit units CU1 to CU4 of the NAND I/F 160. The technique for generating the randomized data is described above, and also in U.S. Pat. No. 9,921,772, which is incorporated by reference herein, and U.S. patent application Ser. No. 16/567,898, filed Sep. 11, 2019, which is incorporated by reference herein. Thus, an input value that is input to the first output buffer circuit 10 and an input value that is input to the second output buffer circuit 20 are different from each other with a probability of about 50%, such that the "0" and "1" values are reversed.

In the present embodiment, the data converter 180 is implemented by a hardware processor (for example, the CPU 140) in the memory controller 100 executing a program. However, a part or whole of the data converter 180 may be implemented by one or more of: a large scale integration (LSI) circuit, an application specific integrated circuit (ASIC), a field-programmable gate array (FPGA), and a programmable logic device (PLD).

2.2 Configuration of NAND Device

Next, a description will be made of a configuration of the NAND device 200. The NAND device 200 has, for example, an interface 210, a memory cell array 220, and a peripheral circuit 230. The interface 210 is connected to the NAND I/F 160 of the memory controller 100 via the transmission lines L0 to L7, and performs transmission and reception of signals with the NAND I/F 160. The memory cell array 220 includes a plurality of memory cell transistors, and stores data in a nonvolatile manner. The peripheral circuit 230 is connected to the memory cell array 220. For example, the peripheral circuit 230 applies predetermined voltages to various wires of the memory cell array 220 based on signals received by the interface 210, and thus writes write data into the memory cell array 220.

3. Configuration of Circuit Unit

Next, a description will be made of configurations of the first to fourth circuit units CU1 to CU4. The first to fourth circuit units CU1 to CU4 have the same configuration. Thus, hereinafter, the first circuit unit CU1 will be described as a representative.

3.1 Basic Configuration of Output Buffer Circuit

Here, each of the first and second output buffer circuits 10 and 20 in the first circuit unit CU1 has the same configuration as a basic configuration of an output buffer circuit (hereinafter, referred to as an "output buffer circuit BS"). Thus, the output buffer circuit BS will be described first.

Figure 3:
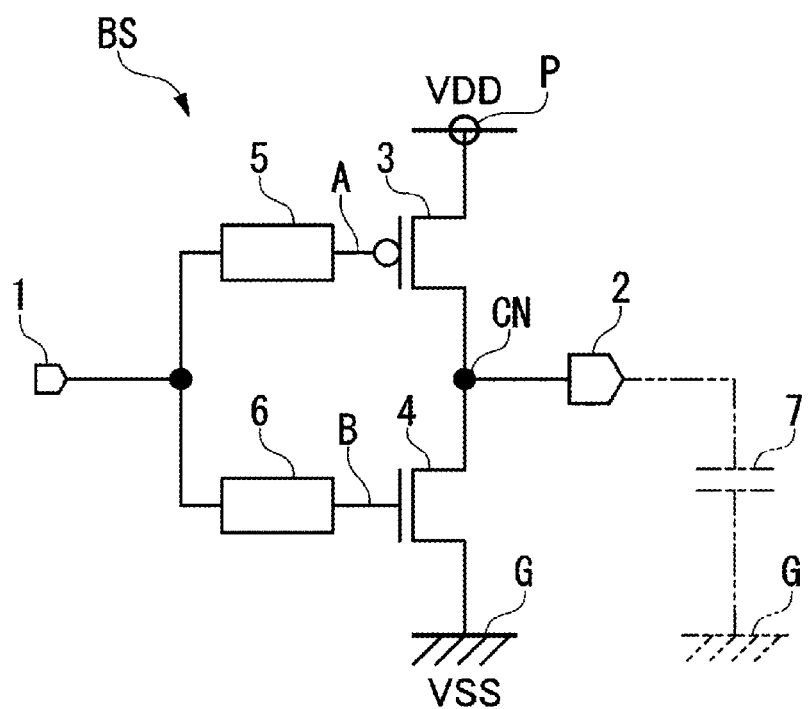
FIG. 3 is a circuit configuration diagram illustrating a basic configuration of an output buffer circuit according to the first embodiment.

FIG. 3 is a circuit configuration diagram illustrating the output buffer circuit BS. The output buffer circuit BS includes an input terminal 1, an external output pad 2, a P-channel metal-oxide semiconductor (PMOS) transistor 3, a N-channel metal-oxide semiconductor (NMOS) transistor 4, a PMOS transistor control circuit 5 (hereinafter, referred to as a "PMOS control circuit 5"), and an NMOS transistor control circuit 6 (hereinafter, referred to as an "NMOS control circuit 6").

A signal as an input value from an internal logic is input to the input terminal 1. In the present embodiment, a data value ("0" or "1") included in randomized data is input to the input terminal 1. Hereinafter, for convenience of description, the data values "1" and "0" will be respectively indicated by "H" or "L".

The external output pad 2 is an example of an "output node". The external output pad 2 is connected to an external load capacitor 7. The external load capacitor 7 is a parasitic capacitor resulting from the transmission line L, a signal line and a bonding wire in the NAND device 200, and input capacitors of other NAND devices 200.

A source of the PMOS transistor 3 is connected to a power source (VDD) P. In the present embodiment, the power source P is a power source having a voltage of 3.0 V or 1.8 V. A drain of the PMOS transistor 3 is connected to the external output pad 2 via a connection node CN. The PMOS transistor 3 is an example of a "first output transistor".

A source of the NMOS transistor 4 is connected to the ground (VSS) G. A drain of the NMOS transistor 4 is connected to the external output pad 2 via the connection node CN. In other words, the drain of the NMOS transistor 4 is connected to the drain of the PMOS transistor 3. The NMOS transistor 4 is an example of a "second output transistor".

The PMOS control circuit 5 performs a predetermined process such as level shifting or timing adjustment on a signal that is input to the input terminal 1, and outputs the signal subjected to the predetermined process to a control gate of the PMOS transistor 3. Consequently, the PMOS control circuit 5 controls the PMOS transistor 3. In the present embodiment, the PMOS control circuit 5 inverts a signal ("H" or "L") that is input to the input terminal 1, and, only when a signal that is input to the input terminal 1 changes from "L" to "H", delays a timing at which a signal that is output from the PMOS control circuit 5 changes, by a predetermined time (a time length corresponding to a period I which will be described later).

The NMOS control circuit 6 performs a predetermined process such as level shifting or timing adjustment on a signal that is input to the input terminal 1, and outputs the signal subjected to the predetermined process to a control gate of the NMOS transistor 4. Consequently, the NMOS control circuit 6 controls the NMOS transistor 4. In the present embodiment, the NMOS control circuit 6 inverts a signal ("H" or "L") that is input to the input terminal 1, and, only when a signal that is input to the input terminal 1 changes from "H" to "L", delays a timing at which a signal that is output from the NMOS control circuit 6 changes, by a predetermined time (a time length corresponding to a period III which will be described later).

3.2 Basic Operation of Output Buffer Circuit

Next, a description will be made of a basic operation of the output buffer circuit BS.

Figure 4:
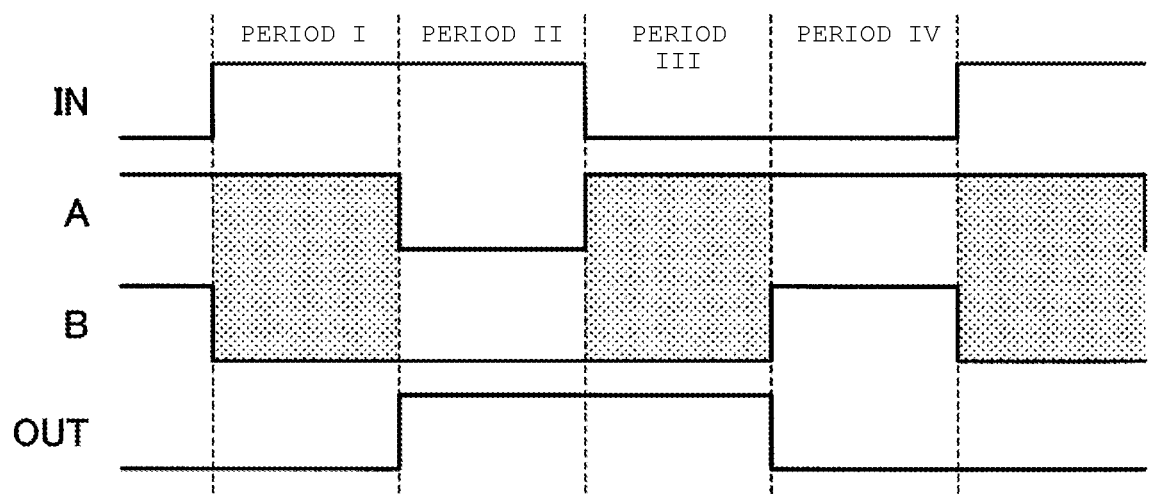
FIG. 4 is a timing chart illustrating a basic operation of the output buffer circuit according to the first embodiment.
Figure 5A:
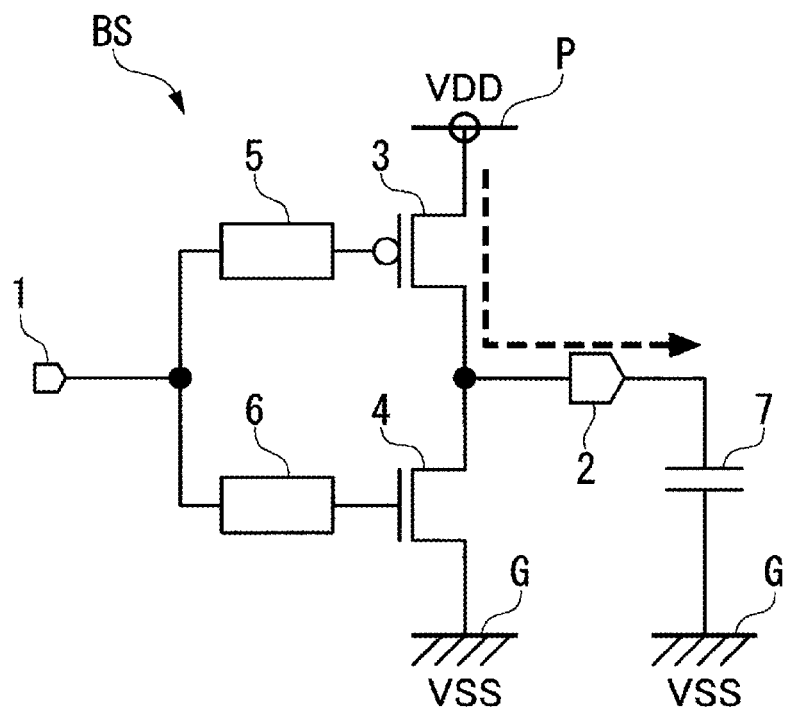
FIG. 5A is a diagram illustrating movement of electric charge in period II of the basic operation of the output buffer circuit according to the first embodiment.
Figure 5B:
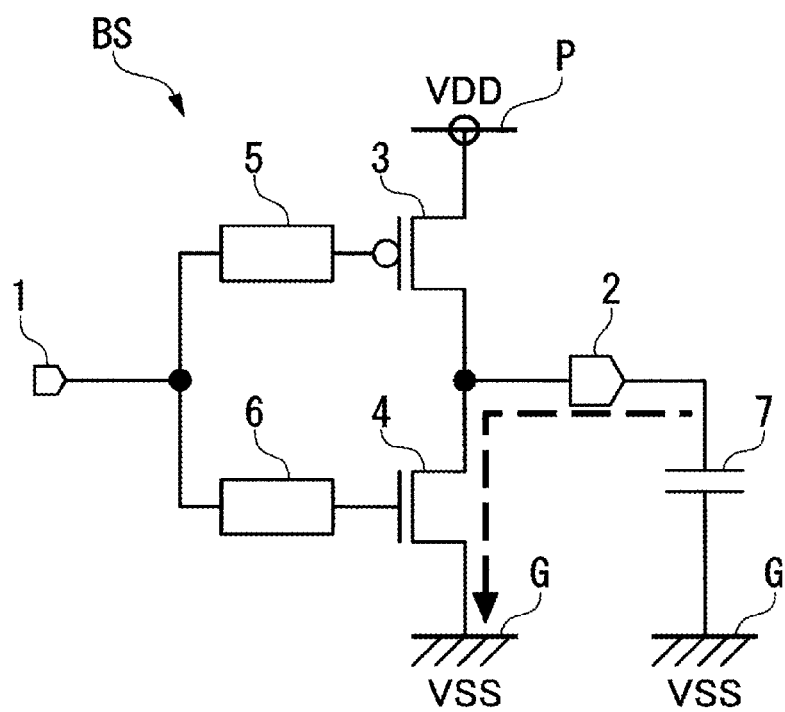
FIG. 5B is a diagram illustrating movement of electric charge in period IV of the basic operation of the output buffer circuit according to the first embodiment.

FIG. 4 is a timing chart illustrating a basic operation of the output buffer circuit BS. "IN", "A", "B", and "OUT" in FIG. 4 respectively indicate signals at the input terminal 1, an internal node A, an internal node B, and the external output pad 2 illustrated in FIG. 3. A hatched region in FIG. 4 indicates a period in which both of the PMOS transistor 3 and the NMOS transistor 4 are in an OFF state. FIGS. 5A and 5B are diagrams respectively illustrating movement of electric charge in a period II and a period IV.

Period I

First, in the period I right after an input signal (IN) that is input to the input terminal 1 changes from "L" to "H", a gate input signal (B) of the NMOS transistor 4 changes from "H" to "L", and thus the NMOS transistor 4 enters an OFF state. In this case, a change in a gate input signal (A) of the PMOS transistor 3 is delayed by the PMOS control circuit 5. As a result, the PMOS transistor 3 is still in an OFF state. Thus, in the period I, both of the PMOS transistor 3 and the NMOS transistor 4 are in an OFF state, and an output signal (OUT) that is output from the external output pad 2 does not change.

Period II

Next, in the period II, the gate input signal (A) of the PMOS transistor 3 changes from "H" to "L" shortly after the input signal (IN) changes, and thus the PMOS transistor 3 enters an ON state. When the PMOS transistor 3 enters an ON state, the external load capacitor 7 is charged with electric charge from the power source P (refer to FIG. 5A), and the output signal (OUT) changes from "L" to "H", "L" of the output signal (OUT) indicates that a signal with a low level (for example, 0 V) is output. "H" of the output signal (OUT) indicates that a signal with a high level (for example, a voltage level of the power source P) is output.

Period III

Next, in the period III right after the input signal (IN) changes from "H" to "L", the gate input signal (A) of the PMOS transistor 3 changes from "L" to "H", and thus the PMOS transistor 3 enters an OFF state. In this case, a change in a gate input signal (B) of the NMOS transistor 4 is delayed by the NMOS control circuit 6. As a result, the NMOS transistor 4 is still in an OFF state. Thus, in the period III, both of the PMOS transistor 3 and the NMOS transistor 4 are in an OFF state, and the output signal (OUT) that is output from the external output pad 2 does not change.

Period IV

Next, in the period IV, the gate input signal (B) of the NMOS transistor 4 changes from "L" to "H" shortly after the input signal (IN) changes, and thus the NMOS transistor 4 enters an ON state. When the NMOS transistor 4 enters an ON state, the electric charge accumulated in the external load capacitor 7 is released to the ground G (refer to FIG. 5B), and the output signal (OUT) changes from "H" to "L".

As described above, the output buffer circuit BS performs charging and discharging of the external load capacitor 7 with electric charge, and thus switches between a state of outputting "L" and a state of outputting "H". Here, the period I and the period III prevent a through-current resulting from both of the PMOS transistor 3 and the NMOS transistor 4 entering an ON state.

3.3 Configuration of First Circuit Unit

Next, a description will be made of a configuration of the first circuit unit CU1.

Figure 6:
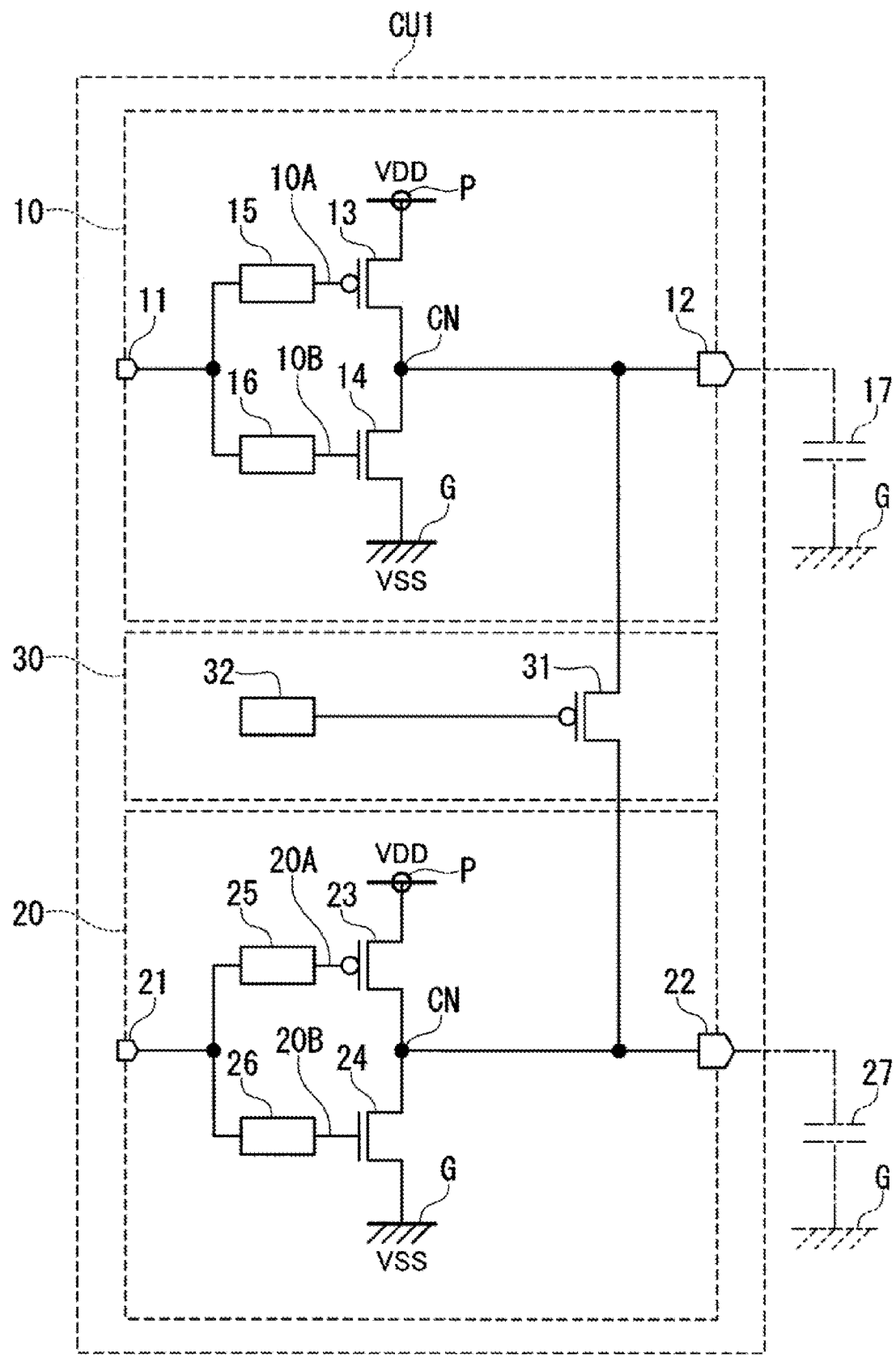
FIG. 6 is a circuit configuration diagram illustrating a configuration of a first circuit unit according to the first embodiment.

FIG. 6 is a circuit configuration diagram illustrating a configuration of the first circuit unit CU1. The first circuit unit CU1 includes, for example, the first output buffer circuit 10, the second output buffer circuit 20, and a bypass circuit 30.

Each of the first output buffer circuit 10 and the second output buffer circuit 20 has the same configuration as that of the output buffer circuit BS. Hereinafter, for convenience of description, a reference numeral obtained by adding 10 to the number of a reference numeral of a corresponding element of the output buffer circuit BS is given to each element of the first output buffer circuit 10, and a reference numeral obtained by adding 20 to the number of a reference numeral of a corresponding element of the output buffer circuit BS is given to each element of the second output buffer circuit 20.

The bypass circuit 30 is connected between the first output buffer circuit 10 and the second output buffer circuit 20. The bypass circuit 30 includes, for example, a bypass transistor 31 and a bypass control circuit 32.

A source of the bypass transistor 31 is connected to an external output pad 12 of the first output buffer circuit 10. A drain of the bypass transistor 31 is connected to an external output pad 22 of the second output buffer circuit 20. The bypass transistor 31 switches electrical connection states between the external output pad 12 of the first output buffer circuit 10 and the external output pad 22 of the second output buffer circuit 20.

The bypass transistor 31 is controlled to enter an ON state by the bypass control circuit 32, and thus electrically connects the external output pad 12 of the first output buffer circuit 10 to the external output pad 22 of the second output buffer circuit 20. On the other hand, the bypass transistor 31 is controlled to enter an OFF state by the bypass control circuit 32, and thus electrically disconnects the external output pad 12 of the first output buffer circuit 10 from the external output pad of the second output buffer circuit 20. The bypass transistor 31 is an example of a "switching element". The "switching element" may be components other than a transistor as long as the components can switch electrical connection states between the external output pad 12 of the first output buffer circuit 10 and the external output pad 22 of the second output buffer circuit 20.

The bypass control circuit 32 applies a gate input signal to a control gate of the bypass transistor 31, and thus switches the bypass transistor 31 between an ON state and an OFF state. In the present embodiment, the bypass control circuit 32 controls the bypass transistor 31 such that the bypass transistor 31 enters an ON state in at least a part of the period I and at least a part of the period III. The bypass control circuit 32 will be described later in detail.

3.4 Operation of Circuit Unit

Next, a description will be made of an operation of the first circuit unit CU1.

Figure 7:
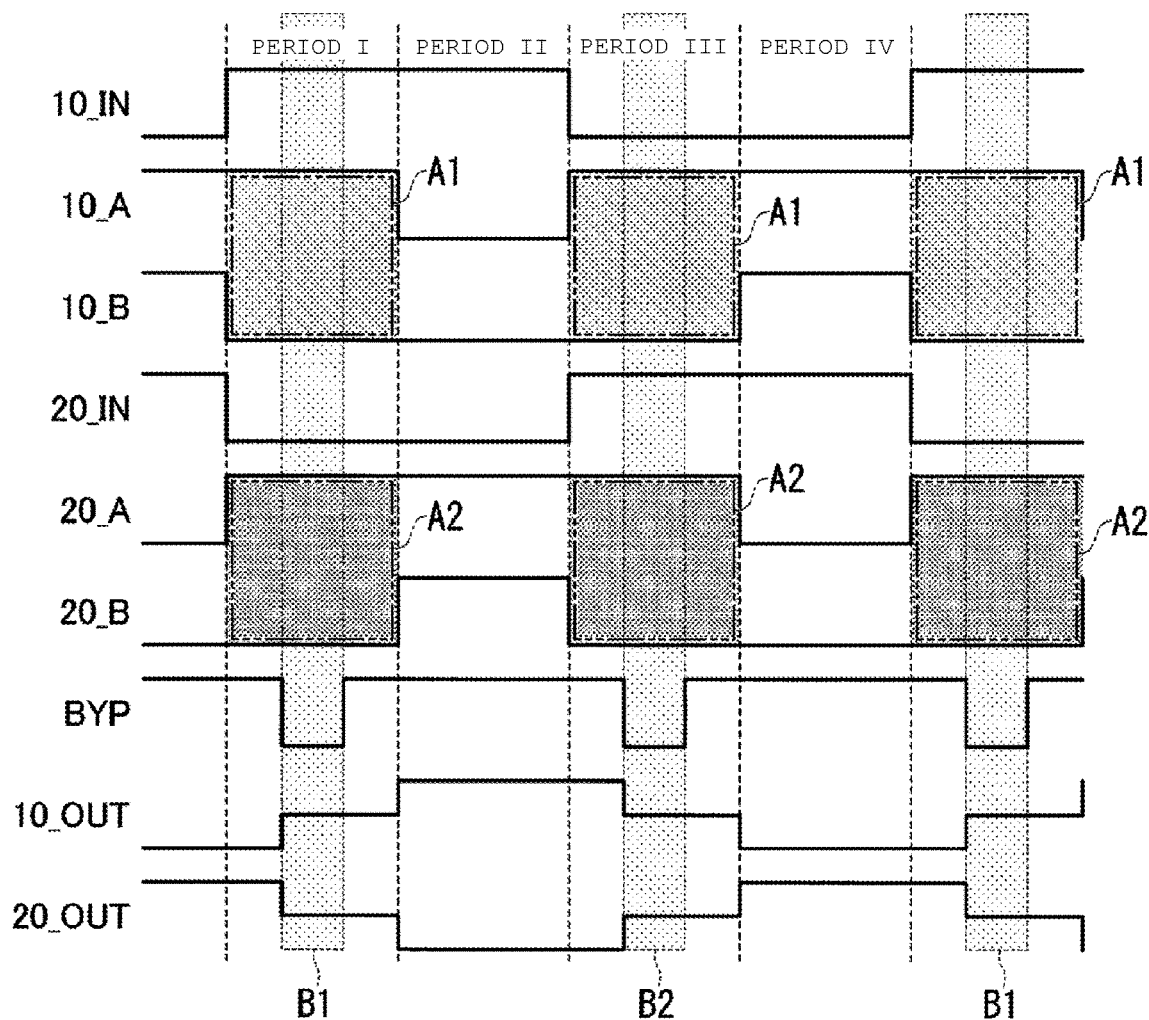
FIG. 7 is a timing chart illustrating an operation of the first circuit unit according to the first embodiment.

FIG. 7 is a timing chart illustrating an operation of the first circuit unit CU1. In FIG. 7, "10_IN", "10_A", "10_B", "20_IN", "20_A", "20_B", "BYP", "10_OUT", and "20_OUT" respectively indicate signals at an input terminal 11, an internal node 10A, an internal node 10B, an input terminal 21, an internal node 20A, an internal node 20B, the control gate of the bypass transistor 31, the external output pad 12, and the external output pad 22 illustrated in FIG. 6. FIG. 7 illustrates an example in which two input signals having an inverse relationship are input to the first output buffer circuit 10 and the second output buffer circuit 20. A region A1 in FIG. 7 indicates a period in which both of a PMOS transistor 13 and an NMOS transistor 14 are in an OFF state. A region A2 in FIG. 7 indicates a period in which both of a PMOS transistor 23 and an NMOS transistor 24 are in an OFF state.

Figure 8A:
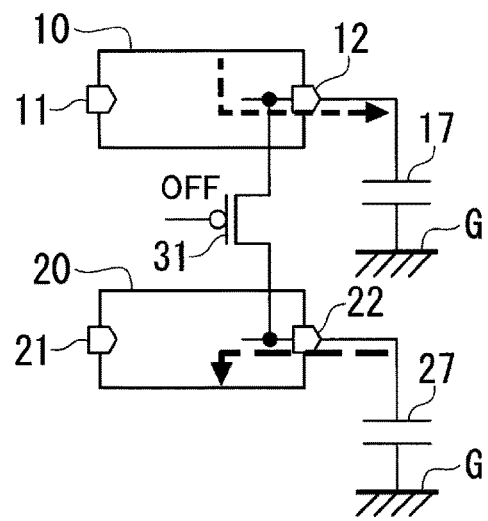
FIG. 8A is a diagram illustrating movement of electric charge in period II in the operation of the first circuit unit according to the first embodiment.
Figure 8B:
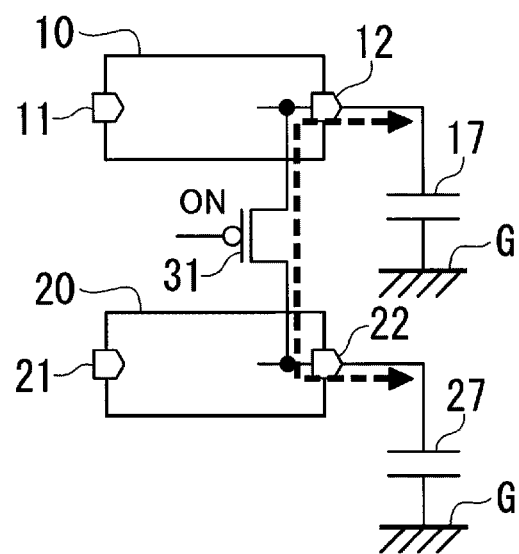
FIG. 8B is a diagram illustrating movement of electric charge in period I and period III in the operation of the first circuit unit according to the first embodiment.
Figure 8C:
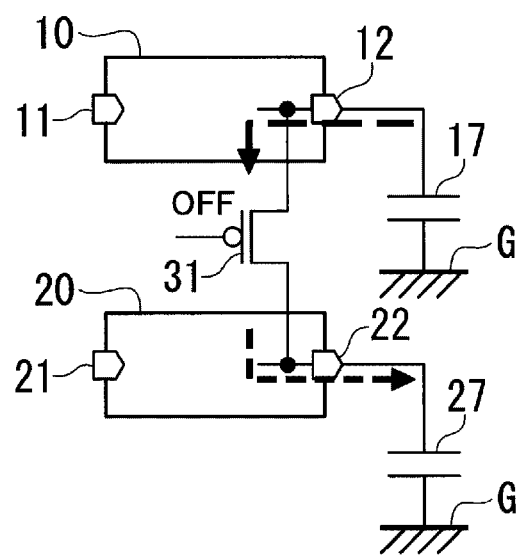
FIG. 8C is a diagram illustrating movement of electric charge in period IV in the operation of the first circuit unit according to the first embodiment.

FIG. 8A is a diagram illustrating movement of electric charge in the period II. FIG. 8B is a diagram illustrating movement of electric charge in the period I and the period III. FIG. 8C is a diagram illustrating movement of electric charge in the period IV. For convenience of description, FIGS. 8A to 8C do not illustrate the internal configuration of the first output buffer circuit 10, the internal configuration of the second output buffer circuit 20, and the bypass control circuit 32.

Period I

First, in the period I right after the input signal (10_IN) that is input to the first output buffer circuit 10 switches from "L" to "H", and the input signal (20_IN) that is input to the second output buffer circuit 20 switches from "H" to "L", in the same manner as in the case of the output buffer circuit BS, the PMOS transistors 13 and 23 and the NMOS transistors 14 and 24 of the two output buffer circuits 10 and 20 enter an OFF state. Thus, the output signal (10_OUT) that is output from the external output pad 12 and the output signal (20_OUT) that is output from the external output pad 22 do not change. In this case, the output signal (10_OUT) has "L" (VSS level), and the output signal (20_OUT) has "H" (VDD level). Thus, electric charge is not accumulated in an external load capacitor 17 connected to the first output buffer circuit 10, and electric charge is in a state of being accumulated in an external load capacitor 27 connected to the second output buffer circuit 20. The gate input signal (BYP) for the bypass transistor 31 is controlled to have "H" by the bypass control circuit 32, and thus the bypass transistor 31 is in an OFF state.

Next, in the period in which the PMOS transistors 13 and 23 and the NMOS transistors 14 and 24 of the two output buffer circuits 10 and 20 are in an OFF state, the bypass control circuit 32 controls the gate input signal (BYP) for the bypass transistor 31 to have "L" such that the bypass transistor 31 is caused to transition to an ON state. Consequently, the external output pad 12 of the first output buffer circuit 10 is electrically connected to the external output pad 22 of the second output buffer circuit 20. As a result, electric charge moves from the external load capacitor 27 connected to the second output buffer circuit 20 to the external load capacitor 17 connected to the first output buffer circuit 10. The movement of electric charge occurs due to only a potential difference between the external load capacitor 17 and the external load capacitor 27, and thus continuously occurs until a balanced voltage (for example, VDD/2 when the external load capacitor 17 and the external load capacitor 27 have the same capacitance) is obtained. Thereafter, the bypass control circuit 32 returns the gate input signal (BYP) for the bypass transistor 31 to "H". Consequently, the bypass transistor enters an OFF state, and thus returns to the same operation as in the basic configuration of the output buffer circuit BS. A region B1 in FIG. 7 indicates a period in which electric charge moves from the external load capacitor 27 to the external load capacitor 17.

Period II

Next, in the period II, in the first output buffer circuit 10, the PMOS transistor 13 enters an ON state such that electric charge is accumulated in the external load capacitor 17, and the output signal (10_OUT) has "H". On the other hand, in the second output buffer circuit 20, the NMOS transistor 24 enters an ON state such that electric charge accumulated in the external load capacitor 27 is released, and the output signal (20_OUT) has "L". In this case, the electric charge that moved from the external load capacitor 27 via the bypass transistor 31 in the period I is accumulated in the external load capacitor 17 connected to the first output buffer circuit 10. Thus, the electric charge may be accumulated up to the VDD level. On the other hand, only electric charge that has not moved remains in the external load capacitor 27 connected to the second output buffer circuit 20, and thus the remaining electric charge may be released. As described above, electric charge in the external load capacitor 27 that would have been released is moved to the external load capacitor 17 by using the bypass transistor 31 such that the electric charge can be reused, and consumption of new electric charge can be prevented.

Period III and Period IV

In the period III and the period IV, operations of the first output buffer circuit 10 and the second output buffer circuit 20 are reversed to each other, and thus electric charge is similarly reused. A region B2 in FIG. 7 indicates a period in which electric charge moves from the external load capacitor 17 to the external load capacitor 27.

4. Bypass Control Circuit

4.1 Operation of Bypass Control Circuit

FIG. 9 illustrates an operation of the bypass control circuit 32. "N" indicates an N-th cycle signal. "N+1" indicates an (N+1)-th cycle signal. "0" and "1" indicate values of an input signal which is supplied to the first output buffer circuit 10 or the second output buffer circuit 20. "OFF" indicates a condition for causing the bypass transistor 31 to enter an OFF state. "ON" indicates a condition for causing the bypass transistor 31 to enter an ON state. These definitions are also the same for FIGS. 12 and 13 which will be described later.

The bypass control circuit 32 of the present embodiment outputs the gate input signal (BYP) having "L" only when the input signal (10_IN) in a cycle (N (where N is a natural number) cycle) and the input signal (10_IN) in a cycle ((N+1) cycle) corresponding to one cycle after the N cycle have an inverse relationship, the input signal (20_IN) in the N cycle and the input signal (20_IN) in the (N+1) cycle have an inverse relationship, and the input signal (10_IN) that is input to the first output buffer circuit 10 in the (N+1) cycle and the input signal (20_IN) that is input to the second output buffer circuit 20 in the (N+1) cycle have an inverse relationship. In all other cases, the bypass control circuit 32 outputs the gate input signal (BYP) having "H".

According to the configuration, between the first output buffer circuit 10 and the second output buffer circuit 20, electric charge that would otherwise be discarded is reused for charging. Thus, it is possible to reduce power consumption of a semiconductor integrated circuit.

In the present embodiment, input values supplied to the first output buffer circuit 10 and the second output buffer circuit 20 are data randomized by the data converter 180. Thus, an input signal that is input to the first output buffer circuit 10 and an input signal that is input to the second output buffer circuit 20 have an inverse relationship with a high probability (a probability of about 50%). The bypass circuit 30 is provided in such a circuit, and thus electric charge can be reused more efficiently.

In the present embodiment, only when reuse of electric charge can be efficiently performed, the bypass transistor 31 enters an ON state, so as to allow the electric charge to move. Thus, it is possible to prevent electric charge from unnecessarily moving to cause heat generation or the like from the first circuit unit CU1, and thus to efficiently reuse electric charge.

5. Example of Bypass Control Circuit

Next, one example of the bypass control circuit 32 will be described. However, a configuration of the bypass control circuit 32 is not limited to the following example.

5.1 Configuration Example of Bypass Control Circuit

Figure 10:
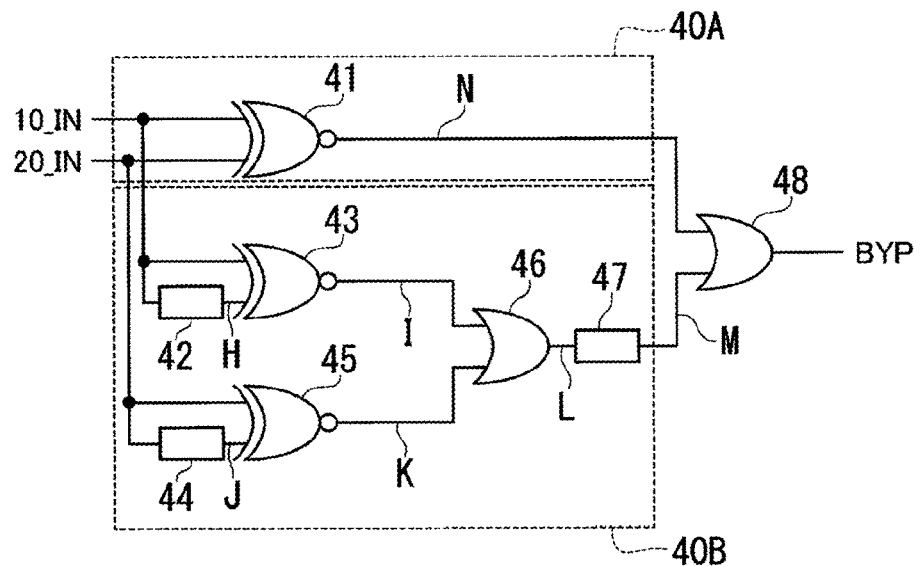
FIG. 10 is a circuit configuration diagram illustrating a configuration of the bypass control circuit according to the first embodiment.

FIG. 10 is an electric circuit diagram illustrating an example of the bypass control circuit 32. The bypass control circuit 32 generates the gate input signal (BYP) that is output to the bypass transistor 31 by using, as inputs, the input signal (10_IN) that is input to the first output buffer circuit 10 and the input signal (20_IN) that is input to the second output buffer circuit 20. The input signal (10_IN) is an example of a "first input signal". The input signal (20_IN) is an example of a "second input signal". The bypass control circuit 32 includes, for example, an inversion checking portion 40A and a toggle detection portion 40B. The inversion checking portion 40A and the toggle detection portion 40B are an example of a "detection circuit". In the present specification, the "toggle" indicates switching of an input signal from "L" to "H" or switching of an input signal from "H" to "L".

The inversion checking portion 40A detects an inverse relationship between a signal scheduled to be output from the external output pad 12 and a signal scheduled to be output from the external output pad 22. For example, the inversion checking portion 40A detects the inverse relationship based on the input signal (10_IN) that is input to the first output buffer circuit 10 and the input signal (20_IN) that is input to the second output buffer circuit 20.

In the present example, the inversion checking portion 40A determines whether or not the input signal (10_IN) and the input signal (20_IN) have the inverse relationship. For example, the inversion checking portion 40A includes an EXNOR circuit 41. The input signal (10_IN) is input to a first input terminal of the EXNOR circuit 41. The input signal (20_IN) is input to a second input terminal of the EXNOR circuit 41. An output terminal of the EXNOR circuit 41 is connected to a first input terminal of an AND circuit 48 which will be described later.

The toggle detection portion 40B detects whether or not each of the input signal (10_IN) and the input signal (20_IN) toggles. The toggle detection portion 40B includes, for example, a delay element 42, an EXNOR circuit 43, a delay element 44, an EXNOR circuit 45, an OR circuit 46, and a delay element 47. Each of the EXNOR circuit 43 and the EXNOR circuit 45 is an example of a "determination circuit".

The delay element 42 delays the input signal (10_IN). The input signal (10_IN) is input to a first input terminal of the EXNOR circuit 43 without passing through the delay element 42. The input signal (10_IN) delayed by the delay element 42 is input to a second input terminal of the EXNOR circuit 43. An output terminal of the EXNOR circuit 43 is connected to a first input terminal of the OR circuit 46.

The delay element 44 delays the input signal (20_IN). The input signal (20_IN) is input to a first input terminal of the EXNOR circuit 45 without using the delay element 44. The input signal (20_IN) delayed by the delay element 44 is input to a second input terminal of the EXNOR circuit 45. An output terminal of the EXNOR circuit 45 is connected to a second input terminal of the OR circuit 46.

An output terminal of the OR circuit 46 is connected to the delay element 47. The delay element 47 delays a signal that is output from the OR circuit 46. An output terminal of the delay element 47 is connected to a second input terminal of an OR circuit 48. An output terminal of the OR circuit 46 is the output terminal of the bypass control circuit 32, and outputs the gate input signal (BYP).

5.2 Operation Example of Bypass Control Circuit

Next, a description will be made of an operation of the bypass control circuit 32.

Figure 11:
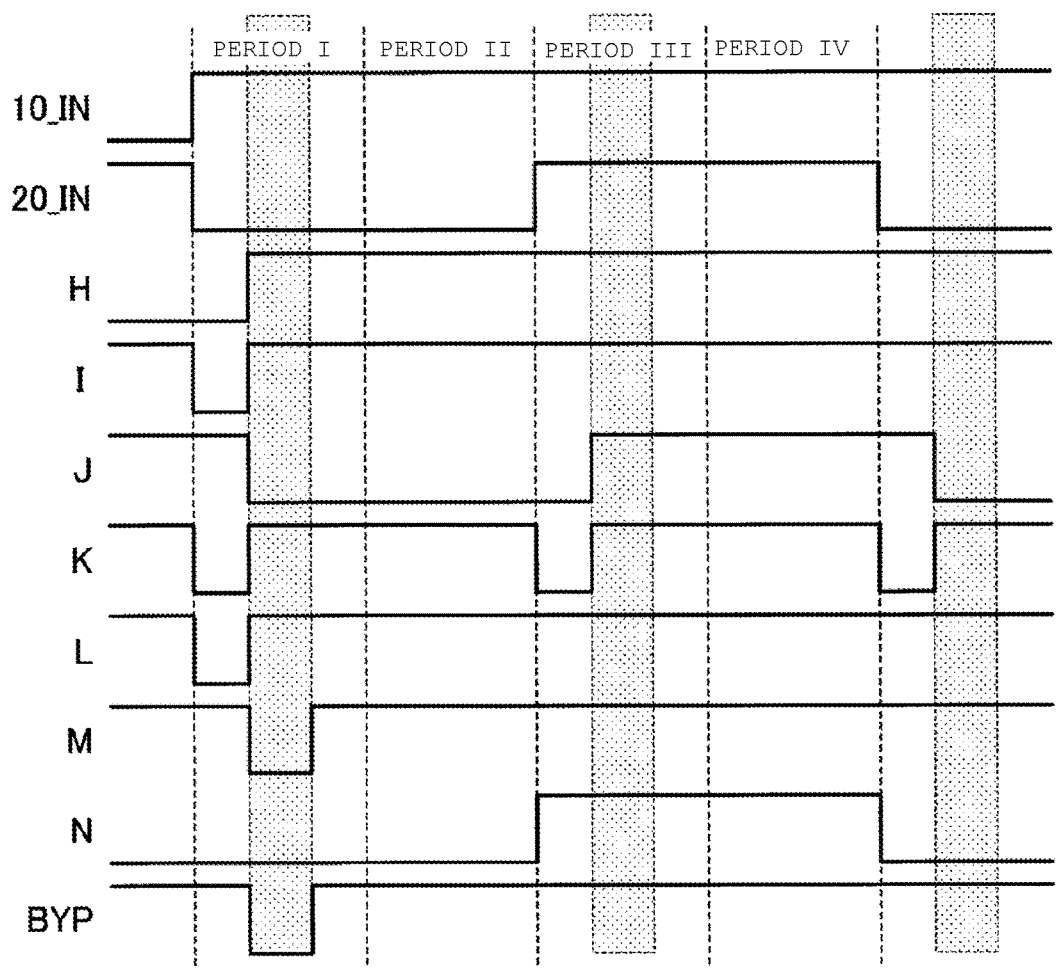
FIG. 11 is a timing chart illustrating the operation of the bypass control circuit according to the first embodiment.

FIG. 11 is a timing chart illustrating an operation of the bypass control circuit 32. "H", "I", "J", "K", "L", "M", and "N" in FIG. 11 respectively indicate signals at a node H, a node I, a node J, a node K, a node L, a node M, and a node N illustrated in FIG. 10.

An output signal (H) from the delay element 42 to which the input signal (10_IN) is input is a signal in which the input signal (10_IN) is delayed depending on a delay amount in the delay element 42. The EXNOR circuit 43 to which the output signal (H) and the input signal (10_IN) are input generates an output signal (I) having "L" only in a period in which the output signal (H) is different from the input signal (10_IN).

Similarly, an output signal (J) from the delay element 44 to which the input signal (20_IN) is input is a signal in which the input signal (20_IN) is delayed depending on a delay amount in the delay element 44. The EXNOR circuit 45 to which the output signal (J) and the input signal (20_IN) are input generates an output signal (K) having "L" only in a period in which the output signal (J) is different from the input signal (20_IN).

An output signal (L) generated as a result of the output signal (I) and the output signal (K) that is input to the OR circuit 46 is a signal having "L" only when both of the input signal (10_IN) and the input signal (20_IN) toggle in the same cycle. An output signal (M) from the delay element 47 to which the output signal (L) is input is a signal in which the output signal (L) is delayed depending on a delay amount in the delay element 47.

On the other hand, the EXNOR circuit 41 to which the input signal (10_IN) and the input signal (20_IN) are input generates an output signal (N) having "L" only when the input signal (10_IN) and the input signal (20_IN) have an inverse relationship. An output signal generated by the OR circuit 48 to which the output signal (N) from the inversion checking portion 40A and the output signal (M) from the toggle detection portion 40B are input is a signal having "L" only when either the input signal (10_IN) or the input signal (20_IN) toggles, and thus pieces of data thereof have an inverse relationship. This output signal is used as the gate input signal (BYP) of the bypass transistor 31, and thus electric charge can be reused as described above.

Here, the delay amounts in the delay element 42 and the delay element 44 are values for determining a period (time length) in which the bypass transistor 31 remains in an ON state. The delay amount in the delay element 47 is a value for determining a timing at which the bypass transistor 31 enters an ON state (at which timing the bypass transistor 31 enters an ON state in the period I and the period III).

According to the configuration, for example, compared with a case of realizing the same function by supplying a clock to a flip-flop circuit, a clock is not necessary, and thus it is possible to reduce power consumption. In other words, according to the configuration of the present example, it is possible to reuse electric charge while reducing power consumption.

6. Modification Example 6.1 First Modification Example of First Embodiment

FIG. 12 illustrates an operation of the bypass control circuit 32 according to a first modification example. The bypass control circuit 32 of the first modification example outputs the gate input signal (BYP) having "L" when the input signal (10_IN) that is input to the first output buffer circuit 10 ("bit0" in FIG. 12) and the input signal (20_IN) that is input to the second output buffer circuit ("bit1" in FIG. 12) have an inverse relationship. The bypass control circuit 32 outputs the gate input signal (BYP) having "H" when the input signal (10_IN) and the input signal (20_IN) do not have an inverse relationship.

Here, the bypass control circuit 32 of the first modification example causes the bypass transistor 31 to enter an ON state when the two input signals (10_IN and 20_IN) in a certain cycle ((N+1) cycle) have an inverse relationship regardless of contents of the input signals (10_IN and 20_IN) in a cycle (N cycle) corresponding to one cycle before the certain cycle. The bypass control circuit 32 may be implemented by, for example, an EXNOR circuit.

According to the configuration of the first modification example, there may be a case where electric charge does not move even though the bypass transistor 31 enters an ON state, but, when the condition as illustrated in FIG. 7 is satisfied, electric charge can be reused by causing the bypass transistor 31 to enter an ON state. According to the configuration of the first modification example, it is possible to simplify a configuration of the bypass control circuit 32 compared with the first embodiment.

7.2 Second Modification Example of First Embodiment

FIG. 13 illustrates an operation of the bypass control circuit 32 according to a second modification example. In the second modification example, the bypass control circuit 32 corresponding to the first output buffer circuit 10 and the bypass control circuit 32 corresponding to the second output buffer circuit 20 are separately provided. When the gate input signal (BYP) having "L" is input from at least one of the bypass control circuit 32 corresponding to the first output buffer circuit 10 or the bypass control circuit 32 corresponding to the second output buffer circuit 20, the bypass transistor 31 enters an ON state.

Specifically, the bypass control circuit 32 corresponding to the first output buffer circuit 10 outputs the gate input signal (BYP) having "L" when the input signal (10_IN) in a certain cycle (N cycle) and the input signal (10_IN) in a cycle ((N+1) cycle) corresponding to one cycle after the certain cycle have an inverse relationship. On the other hand, the bypass control circuit 32 corresponding to the first output buffer circuit 10 outputs the gate input signal (BYP) having "H" when the input signal (10_IN) in a certain cycle (N cycle) and the input signal (10_IN) in a cycle ((N+1) cycle) corresponding to one cycle after the certain cycle do not have an inverse relationship. Such a bypass control circuit 32 may be implemented by a combination of, for example, a delay element detecting toggling of an input signal that is input to the first output buffer circuit 10 and an EXNOR circuit. A configuration of the bypass control circuit 32 corresponding to the second output buffer circuit 20 is the same as the configuration of the bypass control circuit 32 corresponding to the first output buffer circuit 10.

According to the configuration of the second modification example, there may be a case where electric charge does not move even though the bypass transistor 31 enters an ON state, but, when the condition as illustrated in FIG. 7 is satisfied, electric charge can be reused by causing the bypass transistor 31 to enter an ON state. According to the configuration of the second modification example, it is possible to simplify a configuration of the bypass control circuit 32 compared with the first embodiment.

Second Embodiment

Next, a second embodiment will be described. The second embodiment is different from the first embodiment in that the bypass control circuit 32 has a flip-flop circuit. The rest of configuration described below is the same as the configuration in the first embodiment.

In the present embodiment, the gate input signal (BYP) is generated by using the flip-flop circuit. In the first embodiment, the gate input signal (BYP) is generated right near the output buffer circuit, but, in the present embodiment, the gate input signal (BYP) is generated near the output flip-flop circuit. For example, when a pipeline configuration is provided, or a first-in first-out (FIFO) buffer is provided, it is possible to perform determination of toggling and/or determination of inversion between the input signals (10_IN and 20_IN) in a stage earlier than an output clock cycle. Since a signal serving as a basis of the gate input signal (BYP) can be received by the flip-flop circuit, design in a case of an operation at a high frequency may be convenient.

Figure 14:
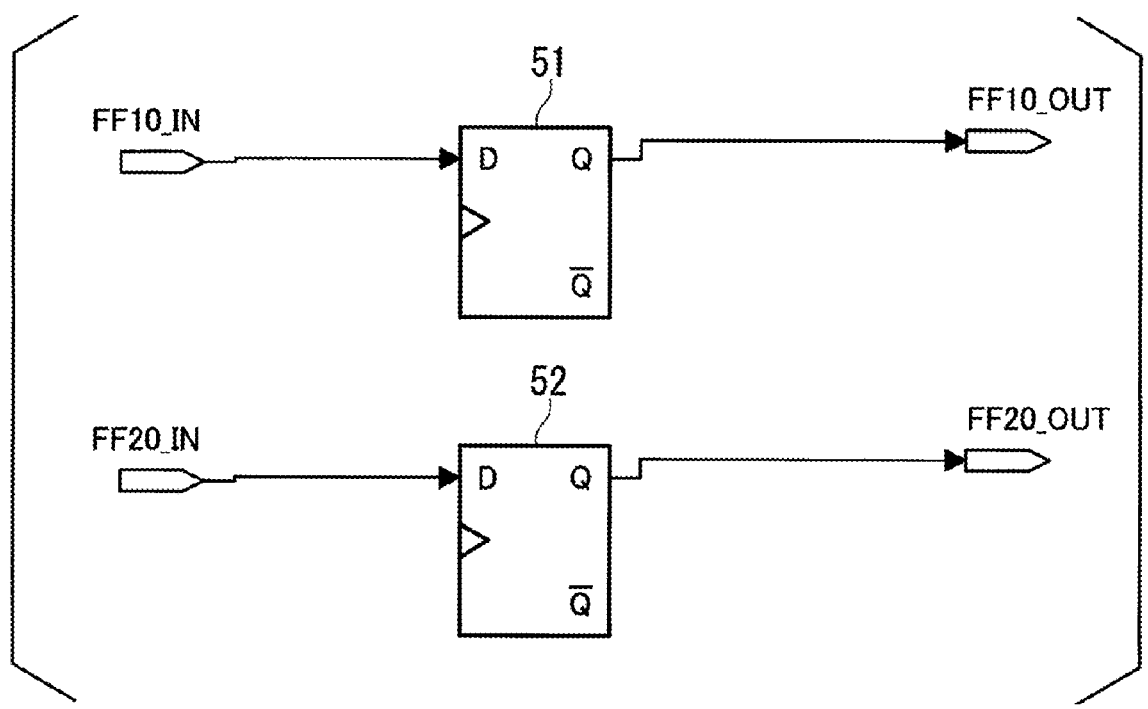
FIG. 14 is a circuit configuration diagram illustrating a part of a bypass control circuit according to a second embodiment.

FIG. 14 is a circuit configuration diagram illustrating a part of the bypass control circuit 32 according to the second embodiment. The bypass control circuit 32 includes first and second flip-flop circuits 51 and 52. The first flip-flop circuit 51 receives an input signal (FF10_IN), and outputs an output signal (FF10_OUT). The output signal (FF10_OUT) corresponds to the input signal (10_IN) in the first embodiment. The input signal (FF10_IN) corresponds to the input signal (10_IN) one cycle before. Similarly, the second flip-flop circuit 52 receives an input signal (FF20_IN), and outputs an output signal (FF20_OUT). The output signal (FF20_OUT) corresponds to the input signal (20_IN) in the first embodiment. The input signal (FF20_IN) corresponds to the input signal (20_IN) one cycle before.

In the present embodiment, the bypass control circuit determines a content ("L" or "H") of the gate input signal (BYP) based on output signals that are output from the flip-flop circuits 51 and 52 provided in the final stage right before the output buffer circuits 10 and 20. However, for example, when a pipeline configuration is provided, a content of the gate input signal (BYP) may be determined based on a signal one or more cycles before.

Figure 15:
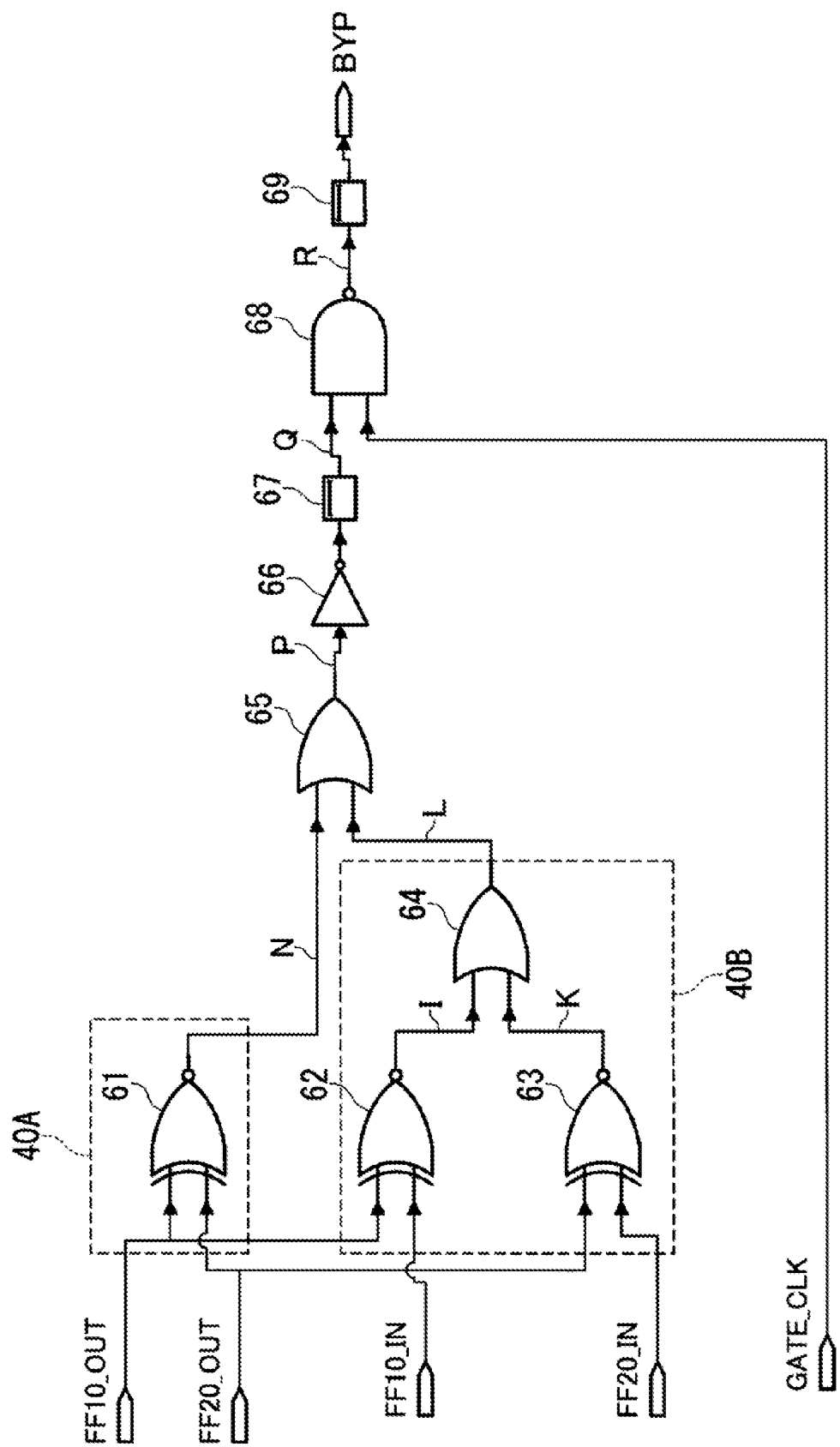
FIG. 15 is a circuit configuration diagram illustrating another part of the bypass control circuit according to the second embodiment.

FIG. 15 is a circuit configuration diagram illustrating another part of the bypass control circuit 32 according to the second embodiment. The bypass control circuit 32 includes, for example, an EXNOR circuit 61, an EXNOR circuit 62, an EXNOR circuit 63, an OR circuit 64, an OR circuit 65, an inverting element 66, a delay element 67, a NAND circuit 68, and a delay element 69.

The input signal (FF10_OUT) that is output from the first flip-flop circuit 51 and the input signal (FF20_OUT) that is output from the second flip-flop circuit 52 are input to the EXNOR circuit 61. The EXNOR circuit 61 generates an output signal (N) having "L" only when the signals have an inverse relationship. The output signal (N) shows a behavior similar to the output signal (N) in the first embodiment. In other words, when the input signal (FF10_OUT) is different from the input signal (FF20_OUT), the output signal (N) has "L". When the input signal (FF10_OUT) matches the input signal (FF20_OUT), the output signal (N) has "H". The output signal (N) from the EXNOR circuit 61 is input to the OR circuit 65.

The input signal (FF10_OUT) that is output from the first flip-flop circuit 51 and the input signal (FF10_IN) not passing through the first flip-flop circuit 51 are input to the EXNOR circuit 62. The EXNOR circuit 62 generates an output signal (I) having "L" only when the signals have an inverse relationship. The output signal (I) from the EXNOR circuit 62 is input to the OR circuit 64. The output signal (I) is a result of the EXNOR circuit 62 determining whether or not the input signal (FF10_OUT) that is input to the first output buffer circuit 10 in a certain cycle and the input signal (FF10_IN) that is input to the first output buffer circuit 10 in the next cycle have the same value. When the input signal (FF10_OUT) and the input signal (FF10_IN) have different values, the output signal (I) has "L". When the input signal (FF10_OUT) and the input signal (FF10_IN) have the same value, the output signal (I) has "H".

The input signal (FF20_OUT) that is output from the second flip-flop circuit 52 and the input signal (FF20_IN) not passing through the second flip-flop circuit 52 are input to the EXNOR circuit 63. The EXNOR circuit 63 generates an output signal (K) having "L" only when the signals have an inverse relationship. The output signal (K) from the EXNOR circuit 63 is input to the OR circuit 64. The output signal (K) is a result of the EXNOR circuit 63 determining whether or not the input signal (FF20_OUT) that is input to the second output buffer circuit 20 in a certain cycle and the input signal (FF20_IN) that is input to the second output buffer circuit 20 in the next cycle have the same value. When the input signal (FF20_OUT) and the input signal (FF20_IN) have different values, the output signal (K) has "L". When the input signal (FF20_OUT) and the input signal (FF20_IN) have the same value, the output signal (K) has "H".

An output signal (L) from the OR circuit 64 has "L" only when both of the output signal (I) and the output signal (K) have "L", and has "H" otherwise. The output signal (L) from the OR circuit 64 is input to the OR circuit 65. In other words, the output signal (L) from the OR circuit 64 has "L" when input signals that are input to both of the two output buffer circuits 10 and 20 that are coupled to each other for reusing electric charge change, and has "H" otherwise.

An output signal (P) from the OR circuit 65 has "L" when values of both of the output signal (N) and the output signal (L) are "L", and has "H" otherwise. The output signal (P) from the OR circuit 65 passes through the inverting element 66 and the delay element 67, and is then input to the NAND circuit 68 as an output signal (Q). A gate clock signal (GATE_CLK) is input to the NAND circuit 68. For example, a duty of the gate clock signal (GATE_CLK) is adjusted in advance. The NAND circuit 68 performs NAND calculation on the output signal (Q) and the gate clock signal (GATE_CLK), to generate an output signal (R). In the above example, the output signal (R) is generated through logical calculation with the gate clock signal (GATE_CLK), but may be generated by another circuit generating a pulse having necessary delay.

The output signal (R) from the NAND circuit 68 is delayed by the delay element 69 to be output as the gate input signal (BYP). The gate input signal (BYP) is the same as the gate input signal (BYP) in the example of the first embodiment. In other words, the gate input signal (BYP) is a pulse having "L" only when electric charge is reused, and having "H" when electric charge is not reused.

Figure 16:
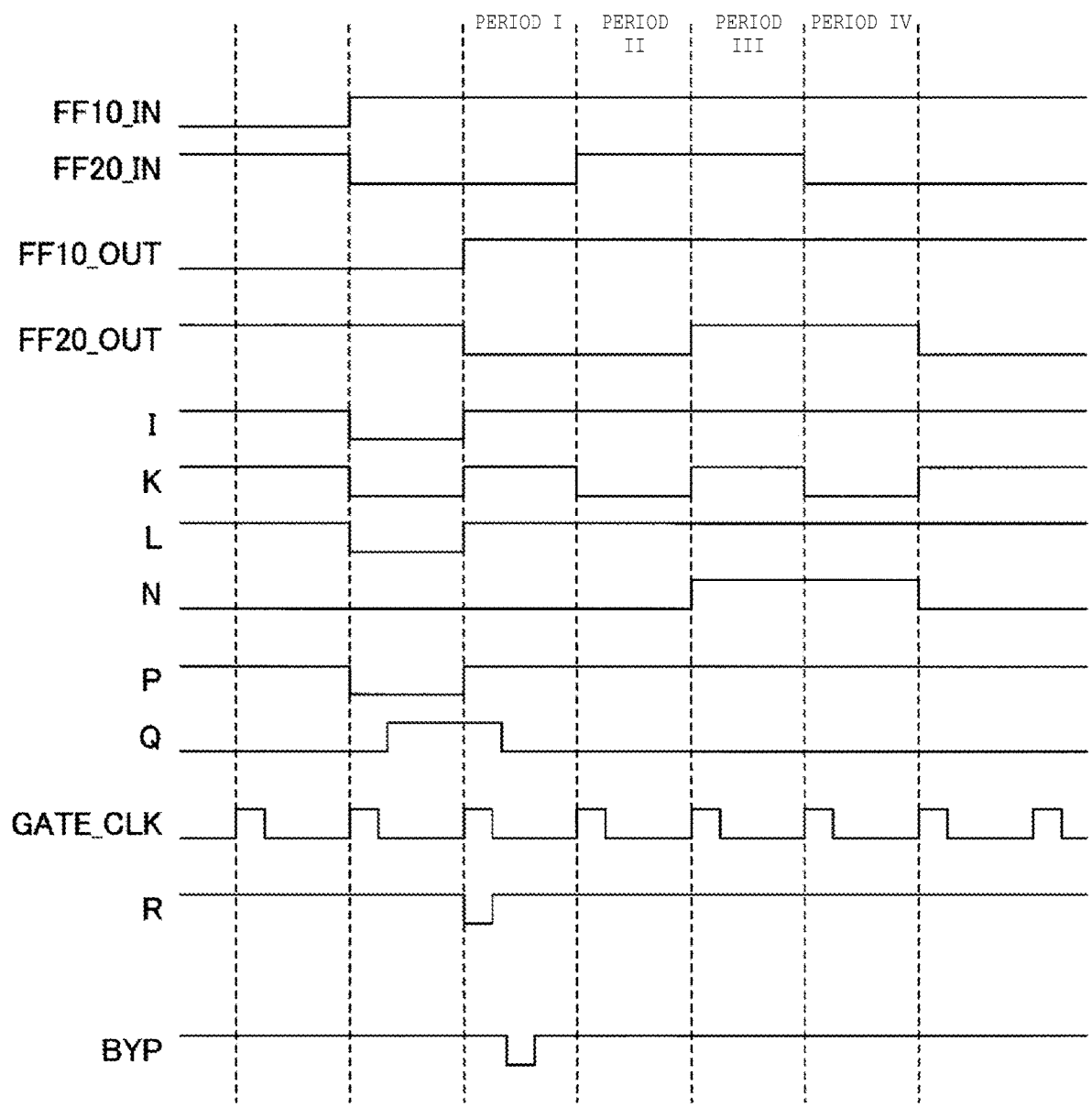
FIG. 16 is a timing chart illustrating an operation of the bypass control circuit according to the second embodiment.

FIG. 16 is a timing chart illustrating an operation of the bypass control circuit 32 according to the second embodiment. "I", "K", "L", "N", "P", "Q", and "R" in FIG. 16 respectively indicate signals at a node I, a node K, a node L, a node N, a node P, a node Q, and a node R in FIG. 15.

In the present embodiment, changes in signals are detected before and after the flip-flop circuits 51 and 52 storing output data, but, when the flip-flop circuits 51 and 52 storing output data have a pipeline configuration, are staged, or have a FIFO buffer using a register file or the like, for a high speed operation, the flip-flop circuits may not be provided right before the output buffer circuits 10 and 20. When a flip-flop circuit for an odd cycle and a flip-flop circuit for an even cycle such as a double data rate (DDR) flip-flop circuit or the like are separately provided, the gate input signal (BYP) may be generated by using inputs or outputs of the flip-flop circuit for an odd cycle and the flip-flop circuit for an even cycle. When a pipeline configuration is provided, or the gate input signal (BYP) is generated by using at least one of an odd cycle or an even cycle of a DDR flip-flop circuit and an input side signal of the flip-flop circuit, it can be determined whether or not an electric charge reuse condition is established at a timing one or more clock cycles earlier than an output cycle. Thus, the flip-flop circuit may receive a signal serving as a basis of the gate input signal (BYP), and an output from the flip-flop circuit may be input to a pulse generation circuit, so that a pulse of the gate input signal (BYP) is generated. In this case, since an electric charge reuse process is determined in a cycle before the output, the gate input signal (BYP) is effective when a critical timing path occurs.

Third Embodiment

Next, a third embodiment will be described. The third embodiment is different from the first embodiment in that electric charge moves among three or more output buffer circuits. The rest of configuration described below is the same as the configuration in the first embodiment.

Figure 17:
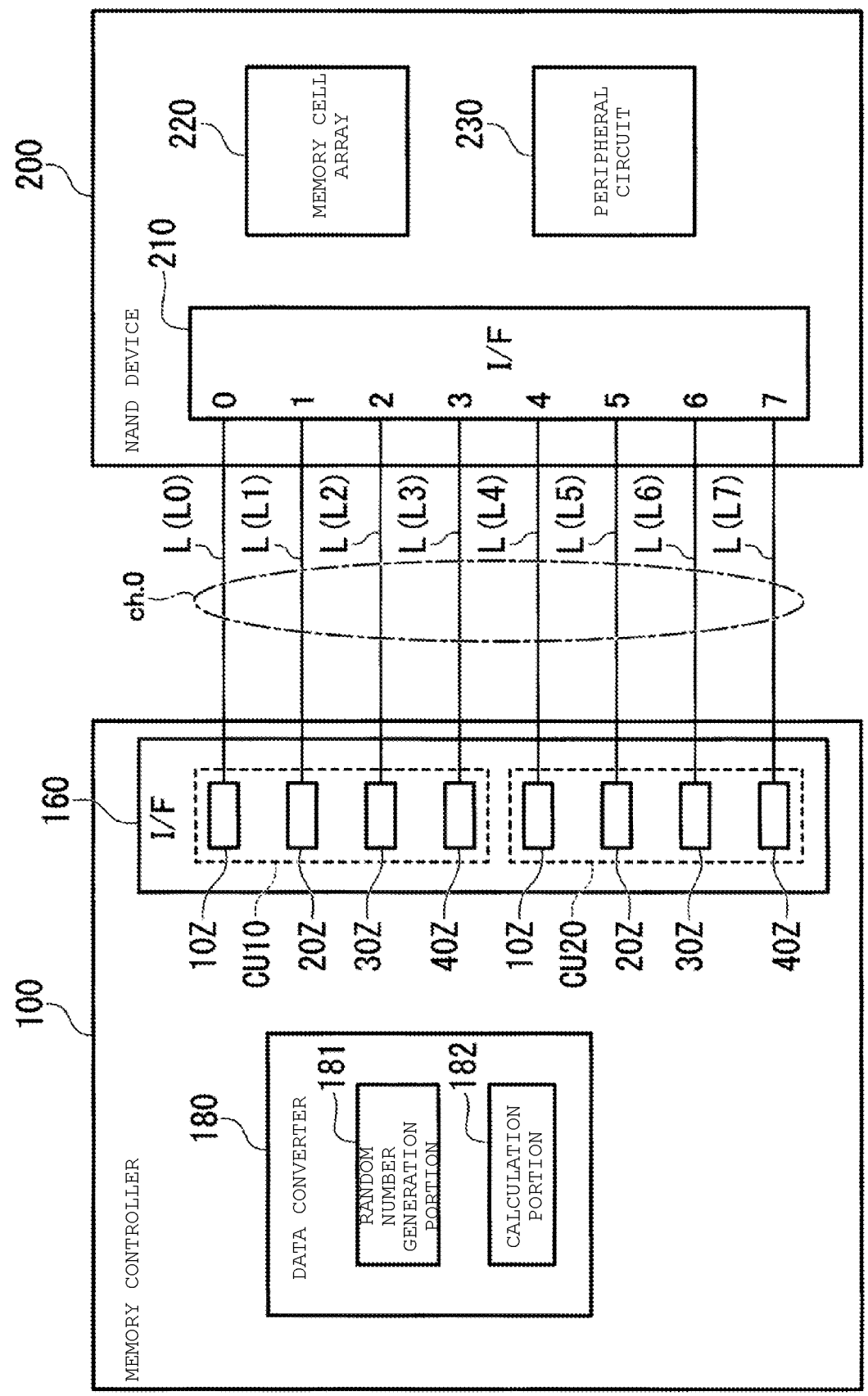
FIG. 17 is a block diagram illustrating configurations of a memory controller and a NAND device according to a third embodiment.

FIG. 17 is a block diagram illustrating configurations of a memory controller 100 and a NAND device 200 according to the third embodiment. In the third embodiment, the NAND I/F 160 includes two circuit units CU10 and CU20. Each of the first and second circuit units CU10 and CU20 includes first to fourth output buffer circuits 10Z, 20Z, 30Z, and 40Z, and a bypass circuit 70 (refer to FIG. 18). The first to fourth output buffer circuits 10Z, 20Z, 30Z, and 40Z are connected to the NAND device 200 via the different transmission lines L. The first and second circuit units CU10 and CU20 have the same configuration. Therefore, hereinafter, the first circuit unit CU10 will be described as a representative.

Figure 18:
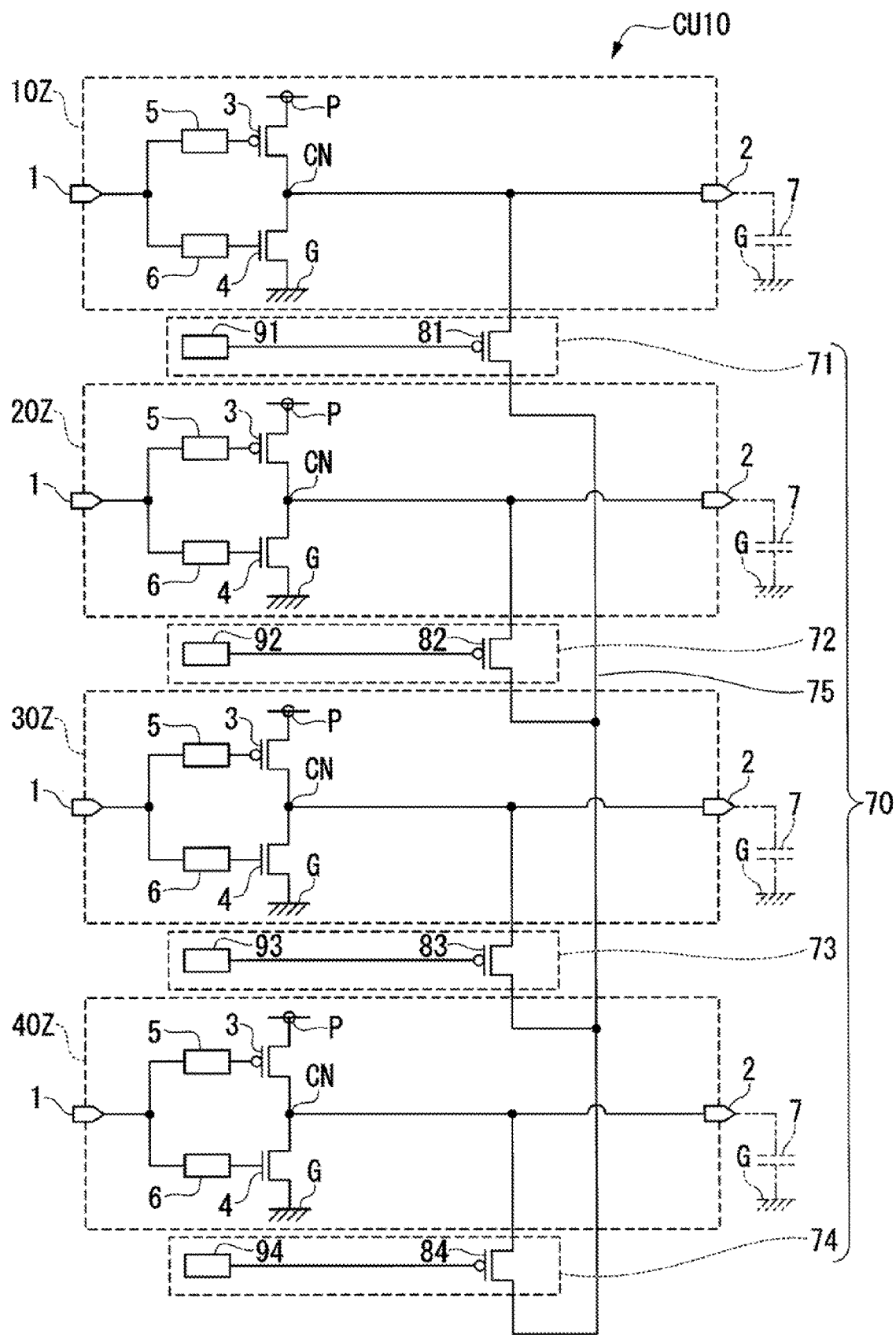
FIG. 18 is a circuit configuration diagram illustrating a configuration of a first circuit unit according to the third embodiment.

FIG. 18 is a circuit configuration diagram illustrating a configuration of the first circuit unit CU10. Each of the first to fourth output buffer circuits 10Z, 20Z, 30Z, and 40Z has the same configuration as that of the output buffer circuit BS described in the first embodiment.

The bypass circuit 70 connects the first to fourth output buffer circuits 10Z, 20Z, 30Z, and 40Z to each other. The bypass circuit 70 includes bypass circuits 71 to 74, and a bypass line (bypass bus) 75. First to fourth bypass transistors 81 to 84 which will be described later are electrically connected in parallel to the bypass line 75.

The first bypass circuit 71 includes the first bypass transistor 81 and a first bypass control circuit 91. A source of the first bypass transistor 81 is connected to an external output pad 2 of the first output buffer circuit 10Z. A drain of the first bypass transistor 81 is connected to the bypass line 75. The first bypass transistor 81 switches electrical connection states between the external output pad 2 of the first output buffer circuit 10Z and the bypass line 75. The first bypass control circuit 91 switches the first bypass transistor 81 between an ON state and an OFF state by applying the gate input signal (BYP) to a control gate of the first bypass transistor 81.

The second bypass circuit 72 includes the second bypass transistor 82 and a second bypass control circuit 92. A source of the second bypass transistor 82 is connected to an external output pad 2 of the second output buffer circuit 20Z. A drain of the second bypass transistor 82 is connected to the bypass line 75. The second bypass transistor 82 switches electrical connection states between the external output pad 2 of the second output buffer circuit 20Z and the bypass line 75. The second bypass control circuit 92 switches the second bypass transistor 82 between an ON state and an OFF state by applying the gate input signal (BYP) to a control gate of the second bypass transistor 82.

The third bypass circuit 73 includes the third bypass transistor 83 and a third bypass control circuit 93. A source of the third bypass transistor 83 is connected to an external output pad 2 of the third output buffer circuit 30Z. A drain of the third bypass transistor 83 is connected to the bypass line 75. The third bypass transistor 83 switches electrical connection states between the external output pad 2 of the third output buffer circuit 30Z and the bypass line 75. The third bypass control circuit 93 switches the third bypass transistor 83 between an ON state and an OFF state by applying the gate input signal (BYP) to a control gate of the third bypass transistor 83.

The fourth bypass circuit 74 includes the fourth bypass transistor 84 and a fourth bypass control circuit 94. A source of the fourth bypass transistor 84 is connected to an external output pad 2 of the fourth output buffer circuit 40Z. A drain of the fourth bypass transistor 84 is connected to the bypass line 75. The fourth bypass transistor 84 switches electrical connection states between the external output pad 2 of the fourth output buffer circuit 40Z and the bypass line 75. The fourth bypass control circuit 94 switches the fourth bypass transistor 84 between an ON state and an OFF state by applying the gate input signal (BYP) to a control gate of the fourth bypass transistor 84.

Each of the first to fourth bypass transistors 81, 82, 83, and 84 is an example of a "switching element". Each of the first to fourth bypass control circuits 91, 92, 93, and 94 is the same as, for example, the bypass control circuit 32 according to the second modification example of the first embodiment. In other words, input signals that are input to the first to fourth output buffer circuits 10Z, 20Z, 30Z, and 40Z are respectively input to the first to fourth bypass control circuits 91, 92, 93, and 94. Each of the first to fourth bypass control circuits 91 to 94 outputs the gate input signal (BYP) having "L" when an input signal in a certain cycle (N cycle) and an input signal in a cycle ((N+1) cycle) corresponding to one cycle after the certain cycle have an inverse relationship.

Each of the first to fourth bypass control circuits 91 to 94 outputs the gate input signal (BYP) having "H" when an input signal in a certain cycle (N cycle) and an input signal in a cycle ((N+1) cycle) corresponding to one cycle after the certain cycle do not have an inverse relationship.

In other words, the bypass control circuit 91 includes a first detection circuit 91a that detects toggling of a first input signal that is input to the first output buffer circuit 10Z, and causes the bypass transistor 81 to enter an ON state regardless of a state of an inverse relationship between signals scheduled to be output from the second to fourth output buffer circuits 20Z, 30Z, and 40Z and a signal scheduled to be output from the first output buffer circuit 10Z, when the first detection circuit 91a detects toggling of the first input signal.

Similarly, the bypass control circuit 92 includes a second detection circuit 92a that detects toggling of a second input signal that is input to the second output buffer circuit 20Z, and causes the bypass transistor 82 to enter an ON state regardless of a state of an inverse relationship between signals scheduled to be output from the first, third, and fourth output buffer circuits 10Z, 30Z, and 40Z and a signal scheduled to be output from the second output buffer circuit 20Z, when the second detection circuit 92a detects toggling of the second input signal.

The bypass control circuit 93 includes a third detection circuit 93a that detects toggling of a third input signal that is input to the third output buffer circuit 30Z, and causes the bypass transistor 83 to enter an ON state regardless of a state of an inverse relationship between signals scheduled to be output from the first, second, and fourth output buffer circuits 10Z, 20Z, and 40Z and a signal scheduled to be output from the third output buffer circuit 30Z, when the third detection circuit 93a detects toggling of the third input signal.

The bypass control circuit 94 includes a fourth detection circuit 94a that detects toggling of a fourth input signal that is input to the fourth output buffer circuit 40Z, and causes the bypass transistor 84 to enter an ON state regardless of a state of an inverse relationship between signals scheduled to be output from the first to third output buffer circuits 10Z, 20Z, and 30Z and a signal scheduled to be output from the fourth output buffer circuit 40Z, when the fourth detection circuit 94a detects toggling of the fourth input signal.

Figure 19:
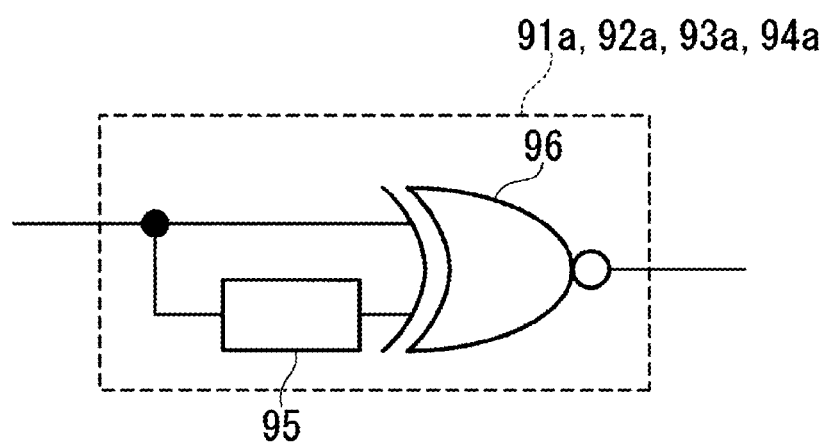
FIG. 19 is a circuit configuration diagram illustrating an example of a detection circuit according to the third embodiment.

FIG. 19 is a circuit configuration diagram illustrating an example of each of the first to fourth detection circuits 91a, 92a, 93a, and 94a. Each of the first to fourth detection circuits 91a, 92a, 93a, and 94a includes a delay element 95 and an EXNOR circuit 96. The delay element 95 delays an input signal. The input signal is input to a first input terminal of the EXNOR circuit 96 without passing through the delay element 95. The input signal delayed by the delay element 95 is input to a second input terminal of the EXNOR circuit 96. An output terminal of the EXNOR circuit 96 is an output terminal of each of the bypass control circuits 91, 92, 93, and 94.

According to the configuration, compared with the first embodiment, electric charge is reused among three or more output buffer circuits, and thus a probability that electric charge may be reused is increased. Thus, it is possible to further reduce power consumption. Details of an operation and an effect of the third embodiment are the same as those of a fourth embodiment which will be described later.

Fourth Embodiment

Next, a fourth embodiment will be described. The fourth embodiment is different from the third embodiment in that each of the bypass control circuits 91, 92, 93, and 94 has a flip-flop circuit. The rest of configuration described below is the same as the configuration in the third embodiment.

Figure 20:
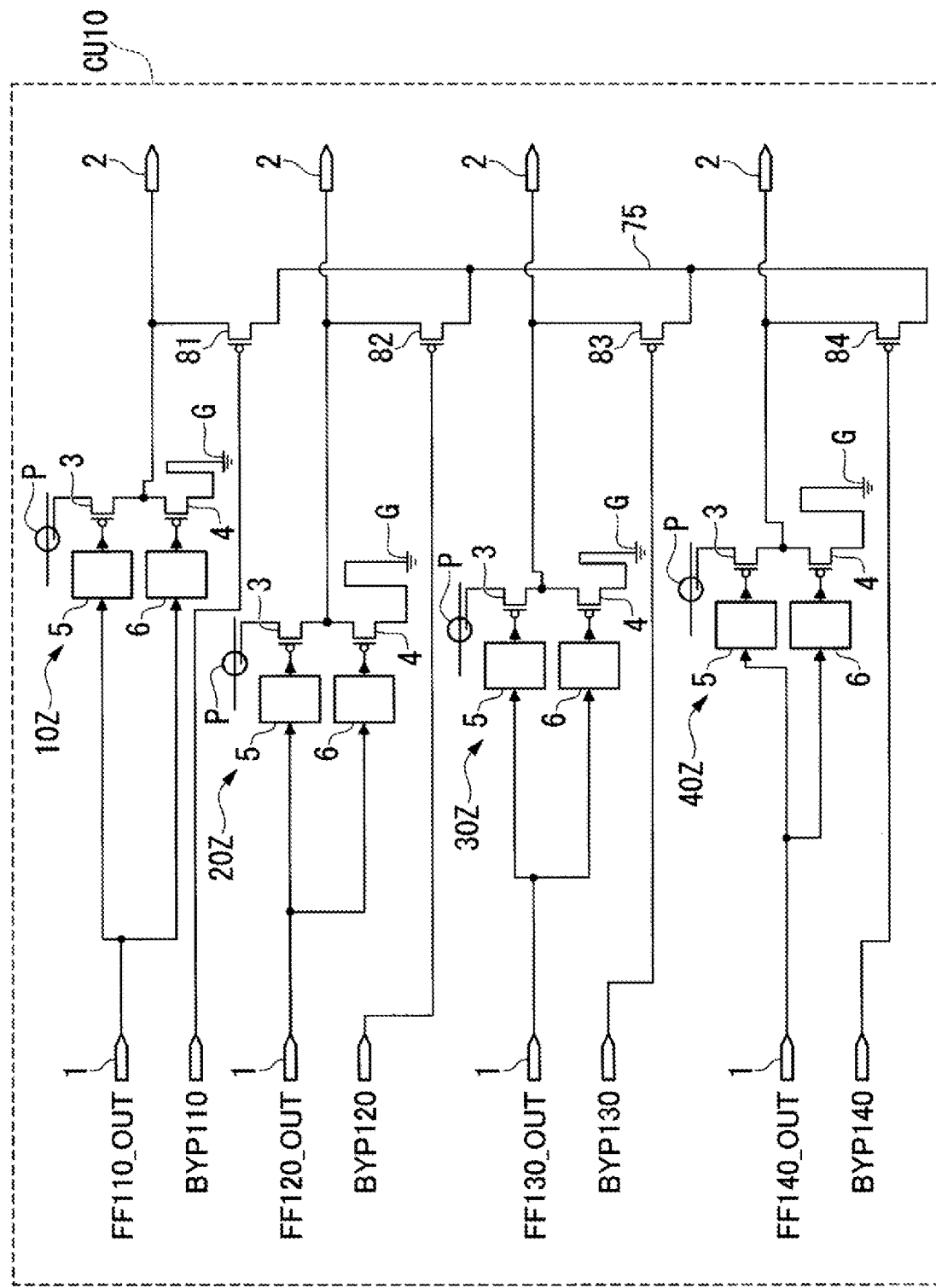
FIG. 20 is a circuit configuration diagram illustrating a part of a configuration of the first circuit unit according to the third embodiment.

FIG. 20 is a circuit configuration diagram illustrating a part of a configuration of the first circuit unit CU10. In the present embodiment, an input signal (FF110_OUT) is input to the input terminal 1 of the first output buffer circuit 10Z. An input signal (FF120_OUT) is input to the input terminal 1 of the second output buffer circuit 20Z. An input signal (FF130_OUT) is input to the input terminal 1 of the third output buffer circuit 30Z. An input signal (FF140_OUT) is input to the input terminal 1 of the fourth output buffer circuit 40Z.

The first bypass transistor 81 is controlled by using a gate input signal (BYP110). The second bypass transistor 82 is controlled by using a gate input signal (BYP120). The third bypass transistor 83 is controlled by using a gate input signal (BYP130). The fourth bypass transistor 84 is controlled by using a gate input signal (BYP140).

Figure 21:
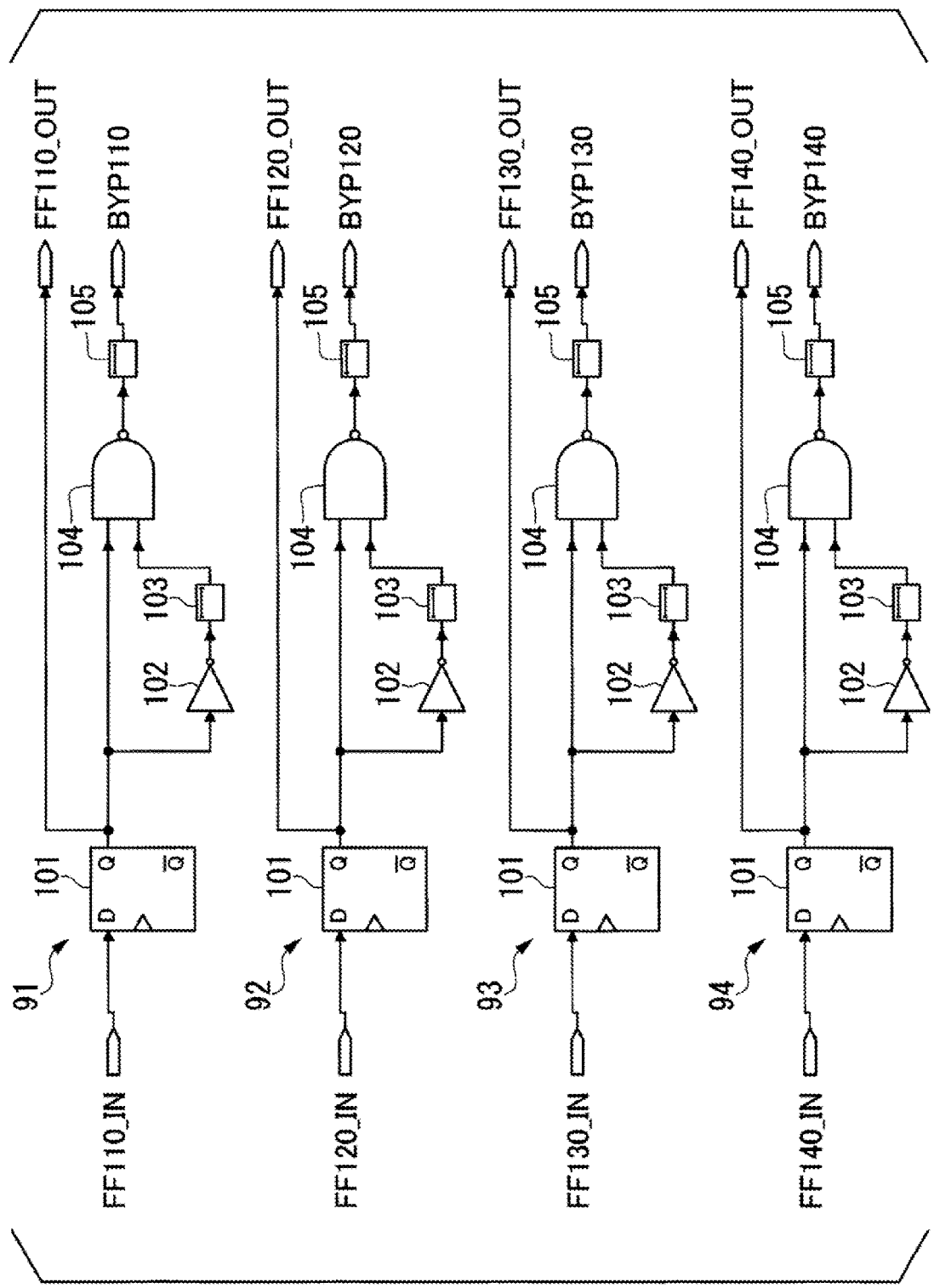
FIG. 21 is a circuit configuration diagram illustrating first to fourth bypass control circuits according to the third embodiment.

FIG. 21 is a circuit configuration diagram illustrating the first to fourth bypass control circuits 91, 92, 93, and 94. The first bypass control circuit 91 includes, for example, a flip-flop circuit 101, an inverting element 102, a delay element 103, a NAND circuit 104, and a delay element 105.

The flip-flop circuit 101 receives an input signal (FF110_IN), and outputs the output signal (FF110_OUT). The output signal (FF110_OUT) corresponds to the input signal (10_IN) in the first embodiment. The input signal (FF110_IN) corresponds to the input signal (10_IN) one cycle before. The output signal (FF110_OUT) is input to the input terminal 1 of the first output buffer circuit 10Z from the flip-flop circuit 101.

The output signal (FF110_OUT) not passing through the inverting element 102 and the delay element 103 and the output signal (FF110_OUT) having passed through the inverting element 102 and the delay element 103 are input to the NAND circuit 104. An output signal from the NAND circuit 104 is output as the gate input signal (BYP) via the delay element 105.

As mentioned above, the configuration of the first bypass control circuit 91 has been described. A configuration of each of the second to fourth bypass control circuits 92, 93, and 94 is the same as the configuration of the first bypass control circuit 91. Thus, the configuration of each of second to fourth bypass control circuits 92, 93, and 94 may replace the "input signal (FF110_IN)" in the description of the first bypass control circuit 91 with an "input signal (FF120_IN)", an "input signal (FF130_IN)", or an "input signal (FF140_IN)", and may replace the "output signal (FF110_OUT)" with an "output signal (FF120_OUT)", an "output signal (FF130_OUT)", or an "output signal (FF140_OUT)".

The present embodiment is not limited to two signals, and relates to a configuration of reusing electric charges at three or more signals. Here, in the first and second embodiments, bypassing is performed only when output signal levels "0" and "1" of signals forming a pair are inverse to each other, and both of the signals forming a pair change. In the present specification, the term "bypassing" indicates that electric charge is reused by causing a switching element (for example, a bypass transistor) to enter an ON state.

On the other hand, when electric charge is reused at three or more signals, the effect may not be reduced even though bypassing is performed without performing value comparison with other combined signals (checking whether or not there is an inverse relationship). In other words, even though a system of detecting only a change in one signal is employed, a probability that all signals change in the same direction is reduced as the number of signals forming a set is increased. For example, when a data randomizing process is performed as in the memory system 1000, a possibility of being able to reuse electric charge is further increased.

In the example illustrated in FIG. 20, among the first to fourth output buffer circuits 10Z, 20Z, 30Z, and 40Z, only an output buffer circuit in which a value changes is connected to the bypass line 75, and an output buffer circuit in which a value does not change is not connected to the bypass line 75. In FIG. 21, the four output buffer circuits 10Z, 20Z, 30Z, and 40Z are connected to the bypass line 75, but the number of the output buffer circuits connected to the bypass line 75 may be freely chosen in a range of satisfying an operation frequency. When where the data randomizing process is performed, a value in each output buffer is "0" or "1" at random in the memory system 1000. Therefore, as the number of output buffer circuits connected to the bypass line 75 is increased, a probability that electric charge may be reused is increased even though a direction of a change in an output signal from the output buffer circuit is not detected.

For example, a combination of values taken by each output buffer circuit in two cycles is (two cases such as "0" or "1" in each cycle)×(two cycles)=four patterns. For example, when two output buffer circuits are connected to the same bypass line 75, a combination of values taken by the two output buffer circuits during two cycles is 4 patterns×4 patterns=16 patterns, and, among the patterns, patterns in which electric charge can be reused are only two patterns such as a first pattern when one (indicated by "IO1") changes from "0" to "1" (indicated by IO1 (0, 1); the same applies hereafter) and the other (indicated by "IO2") changes from "1" to "0" (IO2 (1, 0)) and a second pattern such as IO1 (1, 0) and IO2 (0, 1). Thus, an occurrence probability is $2/16 = 1/8 = 12.5\%$.

In four output buffer circuits, electric charge can be reused in a half of cases as follows. In reuse of electric charge, since "0" and "1" of an output (hereinafter, referred to as an "IO") from the each output buffer circuit are symmetric, only when the most significant bit (MSB) is "0" in an initial cycle is considered, and a bit may be inverted when the MSB is "1". Since bit replacement is also symmetric, the initial cycle may be classified by "the number of bits corresponding to the output of "1" in all IOs" such that only one case is considered, and bit replacement may be performed in other cases.

From the above description, in only three cases classified by the number of bits of "1" in the first cycle, it is considered in how many cases electric charge can be reused among all output patterns ((2 cases)^(4 bits)=16 cases) in the second cycle. Hereinafter, a state of IOs of 4 bits in the first cycle is expressed by a bit string such as IO_1=(IO_1_4, IO_1_3, IO_1_2, IO_1_1), and a state of IOs of 4 bits in the second cycle is expressed by a bit string such as IO_2=(IO_2_4, IO_2_3, IO_2_2, IO_2_1).

(A) When the number of bits corresponding to the output of "1" in the IOs in the first cycle is 0, such as IO_1=(0, 0, 0, 0), that is, all outputs are "0", electric charge cannot be reused in any of 16 output patterns in the second cycle.

(A1) When there is no change in the IOs, that is, outputs of the IOs in the second cycle are all "0", such as IO_2=(0, 0, 0, 0), electric charge cannot be reused since there is no changes in the outputs (1 pattern).

(A2) When there is a change in the IOs, that is, in cases other than (A1), there is a bit changing from "0" to "1", but there is no bit changing from "1" to "0", and thus there is no bit in which electric charge is supplied with the gate input signal (BYP). Therefore, electric charge cannot be reused (16 patterns−1 pattern=15 patterns).

In other words, electric charge cannot be reused in any of 16 patterns.

(B) When the number of bits corresponding to the output of "1" in the IOs in the first cycle is one, IO_1=(0, 0, 0, 1) is considered as a representative example, and all cases of 16 output patterns in the second cycle are considered. Among the 16 patterns, electric charge can be reused in 7 patterns.

(B1) When all of the IOs in the second cycle are "0", such as IO_2=(0, 0, 0, 0), an output of the 0-th bit of the IO on the least significant bit (LSB) side changes from "1" to "0", but there is no bit from "0" to another output, so that electric charge cannot be reused.

(B2) When one bit of the IOs in the second cycle is "1", and the remaining three bits are "0", there are four cases such as IO_2=(0, 0, 0, 1), (0, 0, 1, 0), (0, 1, 0, 0), and (1, 0, 0, 0). Among the four cases, electric charge can be reused in three cases, and electric charge cannot be reused in one case.

When the LSB of the IO in the second cycle is "1", such as IO_2=(0, 0, 0, 1), there is no change from the first cycle, and thus electric charge cannot be reused.

In the three other cases such as IO_2=(0, 0, 1, 0), (0, 1, 0, 0), and (1, 0, 0, 0), since there is one bit as an IO changing from "0" to "1", and there is one bit as an IO changing from "1" to "0", electric charge can be reused (3 patterns).

(B3) When two bits of the IOs in the second cycle are "1", and the remaining two bits are "0", there are six cases such as IO_2=(0, 0, 1, 1), (0, 1, 0, 1), (0, 1, 1, 0), (1, 0, 0, 1), (1, 0, 1, 0), and (1, 1, 0, 0). Among the six cases, electric charge can be reused in three cases, and cannot be reused in three cases.

When the LSB of the IO in the second cycle is "1", such as IO_2=(0, 0, 1, 1), (0, 1, 0, 1), and (1, 0, 0, 1), there is no bit changing from "1" to "0" from the first cycle to the second cycle, and thus electric charge cannot be reused (3 patterns).

When the LSB of the IO in the second cycle is "0", such as IO_2=(0, 1, 1, 0), (1, 0, 1, 0), and (1, 1, 0, 0), there is one bit changing from "1" to "0" from the first cycle to the second cycle, and there are two bits changing from "0" to "1" from the first cycle to the second cycle, so that electric charge can be reused (3 patterns).

(B4) When three bits of the IOs in the second cycle are "1", and the remaining one bit is "0", there are four cases such as IO_2=(0, 1, 1, 1), (1, 0, 1, 1), (1, 1, 0, 1), and (1, 1, 1, 0). Among the four cases, electric charge can be reused in two cases, and cannot be reused in two cases.

When the LSB of the IO in the second cycle is "1", such as IO_2=(0, 1, 1, 1), (1, 0, 1, 1), and (1, 1, 0, 1), there is no bit changing from "1" to "0" from the first cycle to the second cycle, and thus electric charge cannot be reused (3 patterns).

When the LSB of the IO in the second cycle is "0", such as IO_2=(1, 1, 1, 0), there is a single bit changing from "1" to "0" from the first cycle to the second cycle, and there are three bits changing from "0" to "1" from the first cycle to the second cycle, so that electric charge can be reused (1 pattern).

(B5) When all of the IOs in the second cycle are "1", there is one case such as IO_2=(1, 1, 1, 1). There is no bit changing from "1" to "0" from the first cycle to the second cycle, and thus electric charge cannot be reused.

To summarize (B1) to (B5), among 16 cases (=1+4+6+4+1), electric charge can be reused in 7 patterns (=0+3+3+1+0), and electric charge cannot be reused in 9 patterns (=1+1+3+3+1).

As another example of the case where the number of bits corresponding to the output of "1" in the IOs in the first cycle is one, IO_1=(0, 0, 1, 0), (0, 1, 0, 0), and (1, 0, 0, 0) is equivalent to IO_1=(0, 0, 0, 1) considered this time when the bit is rotated. Thus, electric charge can be reused in 28 patterns (=7 patterns×4), and electric charge cannot be reused in 36 patterns (=9 patterns×4).

(C) When the number of bits corresponding to the output of "1" in the IOs in the first cycle is two, IO_1=(0, 0, 1, 1) is considered as a representative example, and all cases of 16 output patterns in the second cycle are considered. Among the 16 patterns, electric charge can be reused in 7 patterns.

(C1) When all of the IOs in the second cycle are "0", such as IO_2=(0, 0, 0, 0), outputs of the 0-th bit and the first bit of the IOs on the least significant bit (LSB) side change from "1" to "0", but there is no bit changing from "0" to "1", so that there is no bit in which electric charge is supplied with the gate input signal (BYP). Therefore, electric charge cannot be reused (1 pattern).

(C2) When one bit of the IOs in the second cycle is "1", and the remaining three bits are "0", there are four cases such as IO_2=(0, 0, 0, 1), (0, 0, 1, 0), (0, 1, 0, 0), and (1, 0, 0, 0). Among the four cases, electric charge can be reused in two cases, and electric charge cannot be reused in two cases.

In the case of the IOs in the second cycle such as IO_2=(0, 0, 0, 1) and (0, 0, 1, 0), there is a bit changing from "1" to "0" from the first cycle to the second cycle, but there is no bit changing from "0" to "1" from the first cycle to the second cycle, so that electric charge cannot be reused (2 patterns).

In the two other cases such as IO_2=(0, 1, 0, 0) and (1, 0, 0, 0), there is one bit changing from "0" to "1", and there are two bits changing from "1" to "0", so that electric charge can be reused (2 patterns).

(C3) When two bits of the IOs in the second cycle are "1", and the remaining two bits are "0", there are six cases such as IO_2=(0, 0, 1, 1), (0, 1, 0, 1), (0, 1, 1, 0), (1, 0, 0, 1), (1, 0, 1, 0), and (1, 1, 0, 0). Among the six cases, electric charge can be reused in five cases, and cannot be reused in one case.

In the case of the IOs in the second cycle such as IO_2=(0, 0, 1, 1), there is no bit changing from the first cycle to the second cycle, and thus that electric charge cannot be reused (1 pattern).

In the case of IOs in the second cycle such as IO_2=(0, 1, 0, 1), (0, 1, 1, 0), (1, 0, 0, 1), and (1, 0, 1, 0), there is one bit changing from "1" to "0" from the first cycle to the second cycle, and there is one bit changing from "0" to "1" from the first cycle to the second cycle, so that electric charge can be reused (4 patterns).

In the case of IOs in the second cycle such as IO_2=(1, 1, 0, 0), there are two bits changing from "1" to "0" from the first cycle to the second cycle, and there are two bits changing from "0" to "1" from the first cycle to the second cycle, so that electric charge can be reused. This is a case where the efficiency of electric charge reuse is highest (1 pattern).

(C4) When three bits of the IOs in the second cycle are "1", and the remaining one bit is "0", there are four cases such as IO_2=(0, 1, 1, 1), (1, 0, 1, 1), (1, 1, 0, 1), and (1, 1, 1, 0). Among the four cases, electric charge can be reused in two cases, and cannot be reused in two cases.

In the case of the IOs in the second cycle such as IO_2=(0, 1, 1, 1) and (1, 0, 1, 1), there is no bit changing from "1" to "0" from the first cycle to the second cycle, and thus that electric charge cannot be reused (2 patterns).

In the case of IOs in the second cycle such as IO_2=(1, 1, 0, 1) and (1, 1, 1, 0), there is one bit changing from "1" to "0" from the first cycle to the second cycle, and there are two bits changing from "0" to "1" from the first cycle to the second cycle, so that electric charge can be reused (2 patterns).

(C5) When all of the IOs in the second cycle are "1", there is one case such as IO_2=(1, 1, 1, 1). There is no bit changing from "1" to "0" from the first cycle to the second cycle, and thus electric charge cannot be reused.

To summarize (C1) to (C5), among 16 cases (=1+4+6+4+1), electric charge can be reused in 9 patterns (=0+2+5+2+0), and electric charge cannot be reused in 7 patterns (=1+2+1+2+1).

A combination of cases where the number of bits corresponding to the output of "1" in the IOs in the first cycle is two is a total of six cases including five cases such as IO_2=(0, 1, 0, 1), (0, 1, 1, 0), (1, 0, 0, 1), (1, 0, 1, 0), and (1, 1, 0, 0). Thus, electric charge can be reused in 54 patterns (=9 patterns×6), and electric charge cannot be reused in 42 patterns (=7 patterns×6).

(D) A case where the number of bits corresponding to the output of "1" in the IOs in the first cycle is three corresponds to bit inversion in (B), and is thus the same as in (B) when electric charge can be reused and when electric charge cannot be reused. Among 64 patterns, electric charge can be reused in 28 patterns, and electric charge cannot be reused in 36 patterns.

(E) A case where the number of bits corresponding to the output of "1" in the IOs in the first cycle is 0 corresponds to bit inversion in (A), and thus electric charge cannot be reused in any of 16 patterns.

As mentioned above, to summarize (A) to (E), electric charge cannot be reused in 146 patterns (=16+36+42+36+16), electric charge can be reused in 110 patterns (=0+28+54+28+0), and thus electric charge can be reused in the 110 patterns among the 256 patterns, that is, at 42.3%.

Except 16 patterns in which none of the gate input signals (BYP110, BYP120, BYP130, and BYP140) illustrated in FIG. 21 are enabled since a value does not change in the first cycle and the second cycle, electric charge is reused in 110 patterns among 240 patterns (=256−16), that is, at 45.8%. As described in the examination process of (A) to (E), in any case where values are the same as each other in the first cycle or the second cycle, such as IO_1=(0, 0, 0, 0) and (1, 1, 1, 1) or IO_2=(0, 0, 0, 0) and (1, 1, 1, 1), it can be easily recognized that a value changes from "0" to "1" or from "1" to "0", and the case can be easily detected through AND calculation or OR calculation of all bits. Therefore, when a pattern in which all bits are "0" or all bits are "1" is excluded by performing OR calculation between a result of AND calculation of all bits and a result of OR calculation of all bits before the gate input signals (BYP110, BYP120, BYP130, and BYP140) are generated (since the case where a value does not change has been excluded), electric charge can be reused in 110 patterns among 210 patterns (=256−16−15−15) in which any of the gate input signals (BYP110, BYP120, BYP130, and BYP140) is enabled, that is, at 52.4%.

As described above, when the number of IOs belonging to the same group for electric charge reuse is increased from two to four, an electric charge reuse ratio is improved from 12.5% to 42.3%. When the number of IOs belonging to the same group for electric charge reuse is increased to two, four, eight, and sixteen bits, it can be seen that an electric charge reuse ratio is increased in an installation of detecting a bit change and enabling a gate input signal for reusing electric charge with the bit that has changed.

As mentioned above, several embodiments, examples, and modification examples have been described, but embodiments or examples are not limited to the above examples. For example, in the third and fourth embodiments, a description has been made of an example in which the four output buffer circuits are connected to the single bypass line, but five or more (for example, eight or sixteen) output buffer circuits may be connected to a single bypass line. In the embodiments, a description has been made of a case where data changes to any polarity or at any timing. However, in a case of differential signals in which a relationship between two output buffer circuits is normally an inverse relationship (positive/negative or true/complement), the inversion checking portion 40A is not necessary. When change timings of two differential signals are synchronized with clocks, a circuit that detects a clock change point may be used instead of directly using an input signal in the toggle detection portion 40B.

Figure 22:
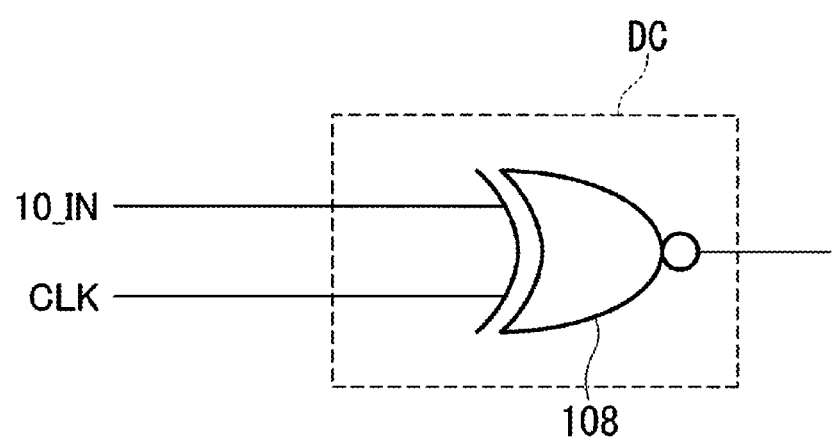
FIG. 22 is a circuit configuration diagram illustrating a detection circuit according to a modification example of the embodiments.

FIG. 22 illustrates an example of a detection circuit DC that receives a synchronization signal having a synchronization relationship with the first input signal that is input to the first output buffer circuit 10 and detects toggling of the first input signal based on the synchronization signal, as one modification example. The detection circuit DC includes, for example, an EXNOR circuit 108. The first input signal (10_IN) that is input to the first output buffer circuit 10 is input to a first input terminal of the EXNOR circuit 108. A clock having a synchronization relationship with the first input signal (10_IN) is input to a second input terminal of the EXNOR circuit 108. The clock is an example of a "synchronization signal". According to the configuration, it is possible to detect toggling of the first input signal by using the EXNOR circuit 108.

According to at least one embodiment described above, a semiconductor integrated circuit includes a switching element switching electrical connection states between a first output node of a first output buffer circuit and a second output node of a second output buffer circuit, and a control circuit controlling the switching element. In this configuration, it is possible to reduce power consumption.

While certain embodiments have been described, these embodiments have been presented by way of example only, and are not intended to limit the scope of the disclosures. Indeed, the novel embodiments described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A memory interface circuit comprising:
   a first output buffer circuit that includes a first output node;
   a second output buffer circuit that includes a second output node;
   a switching element that is electrically connected to the first output node and the second output node, and is controlled to switch electrical connection states between the first output node and the second output node; and
   a control circuit configured to control the switching element, the control circuit including a flip-flop circuit and a detection circuit configured to detect toggling of a first input signal that is input to the first output buffer circuit in two successive cycles, the input signal that is input to the first output buffer circuit in an earlier cycle being stored in the flip-flop circuit, and control the switching element to enter an ON state when the toggling of the first input signal is detected by the detection circuit.

2. The memory interface circuit according to claim 1, wherein the detection circuit is configured to detect an inverse relationship between a signal scheduled to be output through the first output node and a signal scheduled to be output through the second output node, and control the switching element to enter the ON state when the toggling of the first input signal is detected by the detection circuit and the inverse relationship is detected by the detection circuit.

3. The memory interface circuit according to claim 2, wherein the detection circuit detects the inverse relationship based on the first input signal that is input to the first output buffer circuit and a second input signal that is input to the second output buffer circuit.

4. The memory interface circuit according to claim 1, wherein the detection circuit includes a determination circuit, and detects the toggling of the first input signal based on the first input signal that is input to the determination circuit through the flip-flop circuit and the first input signal that is input to the determination circuit without passing through the flip-flop circuit.

5. The memory interface circuit according to claim 1, wherein the detection circuit is configured to detect toggling of a second input signal that is input to the second output buffer circuit, and
wherein the control circuit controls the switching element to enter the ON state when the toggling of the first input signal and the toggling of the second input signal are detected by the detection circuit.

6. The memory interface circuit according to claim 5, wherein the detection circuit is configured to detect an inverse relationship between a signal scheduled to be output through the first output node and a signal scheduled to be output through the second output node, and
wherein the control circuit controls the switching element to enter the ON state when the toggling of the first input signal, the toggling of the second input signal, and the inverse relationship are detected by the detection circuit.

7. A memory interface circuit comprising:
a first output buffer circuit that includes a first output node;
a second output buffer circuit that includes a second output node;
a third output buffer circuit that includes a third output node;
a bypass line;
a first switching element that is electrically connected to the first output node and the bypass line, and is controlled to switch electrical connection states between the first output node and the bypass line;
a second switching element that is electrically connected to the second output node and the bypass line, and is controlled to switch electrical connection states between the second output node and the bypass line;
a third switching element that is electrically connected to the third output node and the bypass line, and is controlled to switch electrical connection states between the third output node and the bypass line; and
a control circuit configured to control the first switching element, the second switching element, and the third switching element.

8. The memory interface circuit according to claim 7, wherein the control circuit includes a first detection circuit configured to detect toggling of a first input signal that is input to the first output buffer circuit, and control the first switching element to enter an ON state regardless of a state of an inverse relationship of a signal scheduled to be output through the first output node with respect to a signal scheduled to be output through the second output node and a signal scheduled to be output through the third output node, when the toggling of the first input signal is detected by the first detection circuit.

9. The memory interface circuit according to claim 8, wherein the control circuit includes a second detection circuit configured to detect toggling of a second input signal that is input to the second output buffer circuit, and control the second switching element to enter an ON state regardless of a state of an inverse relationship of a signal scheduled to be output through the second output node with respect to a signal scheduled to be output through the first output node and a signal scheduled to be output through the third output node, when the toggling of the second input signal is detected by the second detection circuit.

10. A controller comprising:
a data converter that includes a random number generation portion configured to generate a random number, and a calculation portion configured to convert data based on the random number generated by the random number generation portion;
a first output buffer circuit that includes a first output node, and outputs a first signal based on the data converted by the data converter;
a second output buffer circuit that includes a second output node, and outputs a second signal based on the data converted by the data converter;
a switching element that is electrically connected to the first output node and the second output node, and is controlled to switch electrical connection states between the first output node and the second output node; and
a control circuit configured to control the switching element.

11. The controller according to claim 10, wherein the data converter includes a processor that is configured to generate the random number and to convert the data based on the generated random number.

12. The controller according to claim 10, wherein the data is data to be written in a nonvolatile semiconductor memory connected to the controller.

13. The controller according to claim 12, wherein the nonvolatile semiconductor memory includes a plurality of nonvolatile semiconductor memory devices and each of the first and second output nodes is connected to each of the plurality of nonvolatile semiconductor memory devices.

14. The controller according to claim 10,
wherein the control circuit includes a detection circuit configured to detect an inverse relationship between a signal scheduled to be output through the first output node and a signal scheduled to be output through the second output node, and control the switching element to enter an ON state when the inverse relationship is detected by the detection circuit.

15. The controller according to claim 14,
wherein the detection circuit detects the inverse relationship based on a first input signal that is input to the first output buffer circuit and a second input signal that is input to the second output buffer circuit.

16. The controller according to claim 10,
wherein the control circuit includes a detection circuit configured to detect toggling of a first input signal that is input to the first output buffer circuit, and control the switching element to enter an ON state when the toggling of the first input signal is detected by the detection circuit.

17. The controller according to claim 16,
wherein the detection circuit includes a delay element and a determination circuit, and detects the toggling of the first input signal based on the first input signal that is input to the determination circuit through the delay element and the first input signal that is input to the determination circuit without passing through the delay element.

* * * * *